(12) United States Patent
Umeda et al.

(10) Patent No.: US 11,881,444 B2
(45) Date of Patent: Jan. 23, 2024

(54) SEMICONDUCTOR DEVICE

(71) Applicant: SHINDENGEN ELECTRIC MANUFACTURING CO., LTD., Tokyo (JP)

(72) Inventors: Soichiro Umeda, Saitama (JP); Atsushi Kyutoku, Saitama (JP)

(73) Assignee: SHINDENGEN ELECTRIC MANUFACTURING CO., LTD., Tokyo (JP)

( * ) Notice: Subject to any disclaimer, the term of this patent is extended or adjusted under 35 U.S.C. 154(b) by 343 days.

(21) Appl. No.: 17/601,926

(22) PCT Filed: Dec. 16, 2019

(86) PCT No.: PCT/JP2019/049098
§ 371 (c)(1),
(2) Date: Oct. 7, 2021

(87) PCT Pub. No.: WO2020/208867
PCT Pub. Date: Oct. 15, 2020

(65) Prior Publication Data
US 2022/0148946 A1    May 12, 2022

(30) Foreign Application Priority Data

Dec. 16, 2019 (WO) .................. PCT/JP2019/015603

(51) Int. Cl.
*H01L 23/495* (2006.01)
*H01L 23/00* (2006.01)

(52) U.S. Cl.
CPC .. *H01L 23/49544* (2013.01); *H01L 23/49531* (2013.01); *H01L 23/49551* (2013.01);
(Continued)

(58) Field of Classification Search
CPC ......... H01L 23/49544; H01L 23/49531; H01L 23/49551; H01L 24/32; H01L 2224/32245;
(Continued)

(56) References Cited

U.S. PATENT DOCUMENTS

2019/0378782 A1    12/2019    Umeda et al.

FOREIGN PATENT DOCUMENTS

JP        6346717 B1    6/2018

OTHER PUBLICATIONS

International Search Report in PCT/JP2019/049098, datedM ar. 10, 2020. 4pp.

(Continued)

*Primary Examiner* — Robert G Bachner
(74) *Attorney, Agent, or Firm* — HAUPTMAN HAM, LLP

(57) ABSTRACT

A semiconductor device according to the present invention includes: a circuit board; a semiconductor element having a main electrode; a metal frame; and a metal plate having a flat plate shape, the metal plate being disposed between the metal frame and the main electrode, wherein the metal plate and a conductive bonding material, form a stress relaxation structure which relaxes a stress applied to metal plate and the conductive bonding material, disposed between the metal frame and the semiconductor element, and the stress relaxation structure is configured such that a thickness of the metal plate is smaller than a thickness of the metal frame, and at least one convex portion is formed on the metal plate at a position which corresponds to the main electrode. The semiconductor device according to the present invention can relax a stress applied to a conductive bonding material between a semiconductor element and a metal frame even when a relatively thick metal frame is used.

6 Claims, 14 Drawing Sheets

(52) U.S. Cl.
CPC .... *H01L 24/32* (2013.01); *H01L 2224/32245* (2013.01); *H01L 2924/351* (2013.01)

(58) Field of Classification Search
CPC ........... H01L 2924/351; H01L 23/4334; H01L 23/49517; H01L 23/49524; H01L 2224/2612; H01L 23/49503; H01L 23/49811; H01L 23/49844; H01L 23/5386; H01L 23/3735; H01L 24/06; H01L 24/41; H01L 24/84; H01L 25/072; H01L 2224/0603; H01L 2224/06181; H01L 2224/29101; H01L 2224/32225; H01L 2224/33181; H01L 2224/3701; H01L 2224/37147; H01L 2224/40225; H01L 2224/40491; H01L 2224/4103; H01L 2224/48227; H01L 2224/73221; H01L 2224/73265; H01L 2224/84138; H01L 2224/84345; H01L 2224/84801; H01L 2924/00014; H01L 2924/10253; H01L 2924/10272; H01L 2924/1033; H01L 2924/181; H01L 2924/3511; H01L 2924/3512; H01L 2924/35121; H01L 24/40; H01L 24/33
See application file for complete search history.

(56) References Cited

OTHER PUBLICATIONS

Search Report in NL application No. 2025200, dated Jan. 13, 2021, 13pp.

SEMICONDUCTOR DEVICE

RELATED APPLICATIONS

The present application is a National Phase of International Application No. PCT/JP2019/049098 filed Dec. 16, 2019, which claims priority to Japanese Application No. PCT/JP2019/015603 filed Apr. 10, 2019.

TECHNICAL FIELD

The present invention relates to a semiconductor device.

BACKGROUND ART

Conventionally, there has been known a semiconductor device which bonds a semiconductor element mounted on a circuit board with a metal frame such as a lead frame using a conductive bonding material such as a solder (for example, see patent document 1, a conventional semiconductor device 900).

FIG. 16 is a view for describing the conventional semiconductor device 900.

As shown in FIG. 16, the conventional semiconductor device 900 is configured such that a convex portion 941 is formed on a terminal 911 (913) (of a metal frame) which faces a semiconductor element 995, and a conductive bonding material (a conductive adhesive agent, a solder or the like) 975 is disposed between the semiconductor element 995 and the terminal 911 (913). Symbol 999 indicates a jig.

According to the conventional semiconductor device 900, the convex portion 941 is formed on the terminal 911 (913) (of the metal frame) which faces the semiconductor element 995 and hence, a distance between the semiconductor element 995 and the terminal 911 can be maintained at a fixed value or more. Accordingly, a thickness of the conductive bonding material disposed between a region where the convex portion is not formed and the semiconductor element 995 can be set to a fixed value or more and hence, a stress (for example, a thermal stress) applied to the conductive bonding material between the semiconductor element and the metal frame can be relaxed.

PRIOR ART DOCUMENT

Patent Document

Patent document 1: Japanese Patent No. 6346717

SUMMARY OF INVENTION

Problem to be Solved by the Invention

Recently, particularly, in a semiconductor device used for a power use or the like, a relatively thick metal frame is used for allowing the flow of a large current. On the other hand, to satisfy a demand for miniaturization of electric equipment in recent year, the miniaturization of a semiconductor device (and a semiconductor element) has been underway. Accordingly, even when the convex portion of the conventional semiconductor device 900 is intended to be formed by working a relatively thick metal frame, it is not easy to form a convex portion corresponding to a fine main electrode of a (miniaturized) semiconductor element and hence, there exists a drawback that it is difficult to relax a stress (for example, a thermal stress) applied to a conductive bonding material between a semiconductor element and the metal frame while setting a thickness of the conductive bonding material at a fixed value or more by the convex portion.

The present invention has been made in view of the above-mention circumstances, and it is an object of the present invention to provide a semiconductor device which can relax a stress (for example, a thermal stress) applied to a conductive bonding material between a semiconductor element and a metal frame even when a relatively thick metal frame is used.

Solution to Problem

[1] A semiconductor device according to the present invention includes: a circuit board; a semiconductor element mounted on the circuit board, the semiconductor element having a main electrode, the main electrode mounted on a surface of the semiconductor element on a side of the semiconductor element opposite to a side of the semiconductor element which faces the circuit board; a metal frame disposed on the side of the semiconductor element on which the main electrode is mounted; and a metal plate having a flat plate shape, the metal plate being disposed between the metal frame and the main electrode, wherein a conductive bonding material is disposed between the metal plate and the main electrode and between the metal plate and the metal frame, the metal plate and the conductive bonding material are configured to form a stress relaxation structure which relaxes a stress applied to the metal plate and the conductive bonding material between the metal frame and the semiconductor element, and the stress relaxation structure is configured such that a thickness of the metal plate is smaller than a thickness of the metal frame, and at least one convex portion is formed on the metal plate at a position which corresponds to the main electrode.

In this specification, "metal frame" means a flat plate per se made of metal (for example, a lead frame) or a part formed by applying blanking or bending to a flat plate made of metal (for example, clip lead (connector)). Also in this specification, "metal plate having a flat shape" means a plate made of metal which is not largely bent, and it is sufficient that the metal frame has a flat plate shape as a whole even if more or less unevenness exists when viewed strictly. In other words, although an embossed plate made of metal satisfies "metal plate having a flat shape), a plate made of metal to which bending is applied does not satisfy "metal plate having a flat shape).

[2] In the semiconductor device according to the present invention, it is preferable that the stress relaxation structure be configured such that the metal plate is formed of an elastic member.

[3] In the semiconductor device according to the present invention, it is preferable that the stress relaxation structure be configured such that the convex portion is formed on a surface of the metal plate on the main electrode side.

[4] In the semiconductor device according to the present invention, it is preferable that the stress relaxation structure be configured such that the convex portion is formed on both surfaces of the metal plate.

[5] In the semiconductor device according to the present invention, it is preferable that the main electrode have a plurality of regions, and the stress relaxation structure be configured such that the convex portion is formed on the metal plate at positions which correspond to the plurality of regions of the main electrode of the metal plate respectively.

[6] In the semiconductor device according to the present invention, it is preferable that the plurality of regions be respectively independently formed.

In this specification, "independently" means that, for example, a conductive bonding material 52 is substantially independently formed to an extent that the conductive bonding material 52 does not flow into another region disposed adjacently to the region. In this specification, "independently" means not only a case where the regions are completely separated from each other but also a case where the plurality of regions are nominally connected to each other by an extremely thin pattern.

[7] In the semiconductor device according to the present invention, it is preferable that the semiconductor element further have a sub electrode on the surface of the semiconductor element on the side of the semiconductor element opposite to the side of the semiconductor element which faces the circuit board at a position away from the main electrode, and a cutout be formed in the metal plate so as to avoid the sub electrode.

[8] In the semiconductor device according to the present invention, it is preferable that a convex portion be also formed on the metal frame at a position which corresponds to the metal plate.

[9] In the semiconductor device according to the present invention, it is preferable that the metal plate be disposed symmetrically with respect to the center of the main electrode.

[10] In the semiconductor device according to the present invention, it is preferable that the semiconductor element be formed such that a source electrode which forms the main electrode and a gate electrode which forms the sub electrode are formed on the surface of the semiconductor element on the side of the semiconductor element opposite to the side of the semiconductor element which faces the circuit board, and a drain electrode be formed on the surface of the semiconductor element on the side of the semiconductor element which faces the circuit board.

[11] In the semiconductor device according to the present invention, it is preferable that the semiconductor element be formed such that a source electrode and a drain electrode which form the main electrode and a gate electrode which form the sub electrode are formed on a surface of the semiconductor element on the side of the semiconductor element which faces the metal frame side.

[12] In the semiconductor device according to the present invention, it is preferable that a plurality of the semiconductor elements be mounted on the circuit board, and the metal plate is disposed between each of the main electrodes of the semiconductor elements and the metal frame

[13] In the semiconductor device according to the present invention, it is preferable that the circuit board be a ceramic board.

[14] In the semiconductor device according to the present invention, it is preferable that, as viewed in a plan view, an area of the metal plate be smaller than an area of the semiconductor element.

[15] In the semiconductor device according to the present invention, it is preferable that the semiconductor device further include a pin terminal which is disposed in a penetrating manner through the metal frame, one end portion of the pin terminal protrudes to an outside and the other end portion of the pin terminal is connected to a wiring pattern of the circuit board.

Advantageous Effects of Invention

According to the semiconductor device of the present invention, the stress relaxation structure is configured such that at least one convex portion is formed on the metal plate at the position which corresponds to the main electrode. Accordingly, it is possible to ensure a distance amounting to at least a height of the convex portion between the metal plate and the main electrode by the convex portion, and the distance between the region of the metal plate where the convex portion is not formed and the main electrode can be set to a fixed value or more. Accordingly, the thickness of the conductive bonding material disposed between the region of the metal plate where the convex portions are not formed and the main electrode can be set to a fixed value or more. As a result, a stress (for example, a thermal stress) applied to the conductive bonding material between the semiconductor element and the metal frame can be relaxed.

According to the semiconductor device of the present invention, the stress relaxation structure is configured such that the thickness of the metal plate is smaller than the thickness of the metal frame, and at least one convex portion is formed on the metal plate at the position which corresponds to the main electrode. Accordingly, it is unnecessary to form the convex portion by working the metal frame having a relatively large thickness. The convex portion which corresponds to the fine main electrode of the semiconductor element can be formed using the metal plate which has a smaller thickness than the thickness of the metal frame and to which fine working can be easily applied. Particularly, when the metal plate is so thin that the convex portion can be formed by embossing, the convex portion can be easily formed by embossing the metal plate on which the convex portion is formed.

In general, in ensuring a high withstand voltage, to ensure an insulation distance (to prevent short-circuiting between the metal frame and the circuit board), it is necessary to set a thickness of a conductive bonding material relatively large. When a gap between the metal frame and the main electrode is filled with a conductive bonding material in a state where a convex portion is not formed on a metal frame or in a state where only a convex portion having a considerably short compared to a distance between a metal frame and a main electrode is formed on the metal frame, in manufacturing steps, when the metal frame is disposed on the conductive bonding material, there is a concern that the conductive bonding material collapses and hence, it is difficult to enhance reliability of a semiconductor device.

On the other hand, the semiconductor device according to the present invention includes the metal plate having a flat plate shape disposed between the metal frame and the main electrode and hence, it is unnecessary to fill the whole gap between the metal frame and the main electrode with a conductive bonding material. Accordingly, in manufacturing steps, when the metal frame is disposed on the conductive bonding material, it is possible to prevent the conductive bonding material from collapsing and hence, reliability of the semiconductor device is minimally lowered. Further, the stress relaxation structure is configured such that at least one convex portion is formed on the metal plate at the position which corresponds to the main electrode. Accordingly, even in the case where a distance between the metal frame and the main electrode is increased, it is possible to easily maintain a predetermined distance between the metal plate and the main electrode and hence, it is unnecessary to excessively increase a thickness of the conductive bonding material between the metal plate and the metal frame and hence, the conductive bonding material minimally collapses whereby reliability of the semiconductor device is minimally lowered.

According to the semiconductor device of the present invention, the stress relaxation structure is configured such that the thickness of the metal plate is smaller than the thickness of the metal frame and hence, the metal plate per se is deformed by a stress (for example, a thermal stress) applied to the conductive bonding material between the semiconductor element and the metal frame whereby a stress can be absorbed. As a result, a stress (for example, a thermal stress) applied to the conductive bonding material between the semiconductor element and the metal frame can be further relaxed. Further, the stress relaxation structure is configured such that the thickness of the metal plate is smaller than the thickness of the metal frame, and at least one convex portion is formed on the metal plate at the position which corresponds to the main electrode. Accordingly, a thickness of the conductive bonding material disposed between the region of the metal plate where the convex portion is not formed and the main electrode can be set to a fixed value or more. Accordingly, in addition to the absorption of a stress brought about by deformation of the metal plate per se, it is possible to absorb a stress by the conductive bonding material disposed between the region of the metal plate where the convex portion is not formed and the main electrode. As a result, a stress (for example, a thermal stress) applied to the conductive bonding material between the semiconductor element and the metal frame can be further relaxed.

Further, according to the semiconductor device of the present invention, the stress relaxation structure is configured such that at least one convex portion is formed on the metal plate at the position which corresponds to the main electrode, and bonding is performed by collecting the conductive bonding material about a portion of the convex portion of the metal plate and hence, it is possible to bond the electrode and the metal plate with certainty by using such a portion as an initiation point from which solder spreads by wetting. Further, a cutout is formed in the metal plate so as to avoid the sub electrode and hence, spreading by wetting of the solder toward the sub electrode can be suppressed and hence, a possibility that short-circuiting occurs between the main electrode and the sub electrode becomes small.

DESCRIPTION OF EMBODIMENTS

Hereinafter, a semiconductor device according to the present invention is described based on embodiments shown in drawings. The respective drawings are schematic views, and do not always strictly reflect the actual sizes.

Embodiment 1

1. Configuration of Semiconductor Device 100 According to Embodiment 1

Figure 1A:
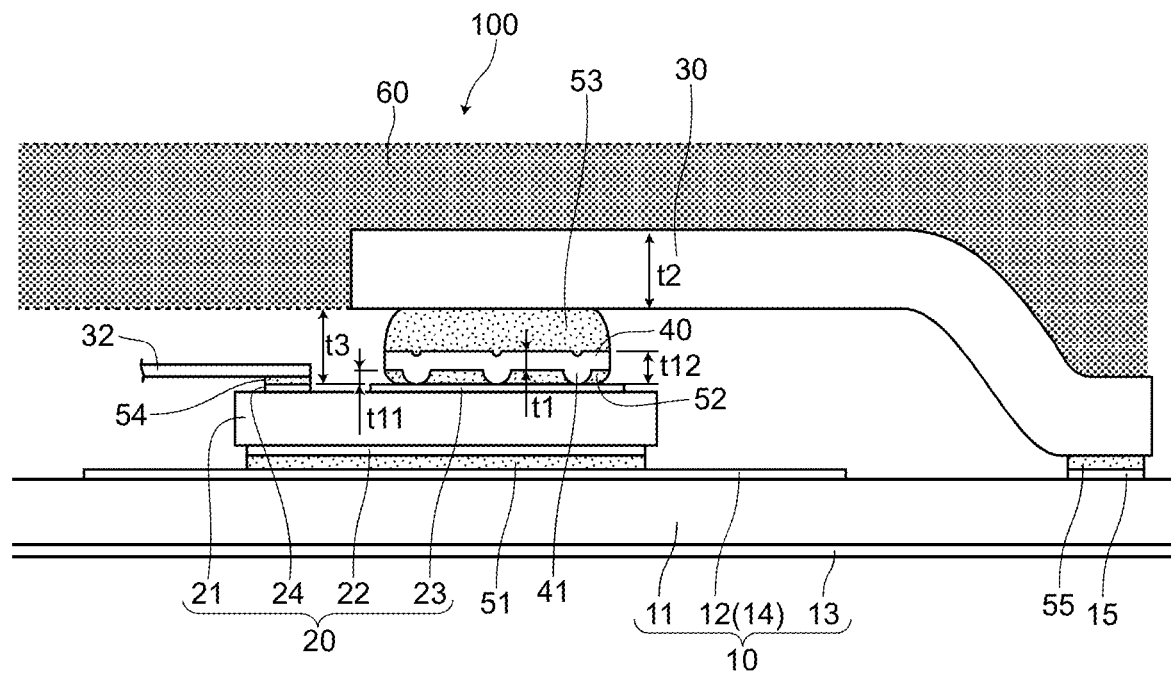
FIG. 1A and FIG. 1B are views for describing a semiconductor device 100 according to an embodiment 1.
Figure 1B:
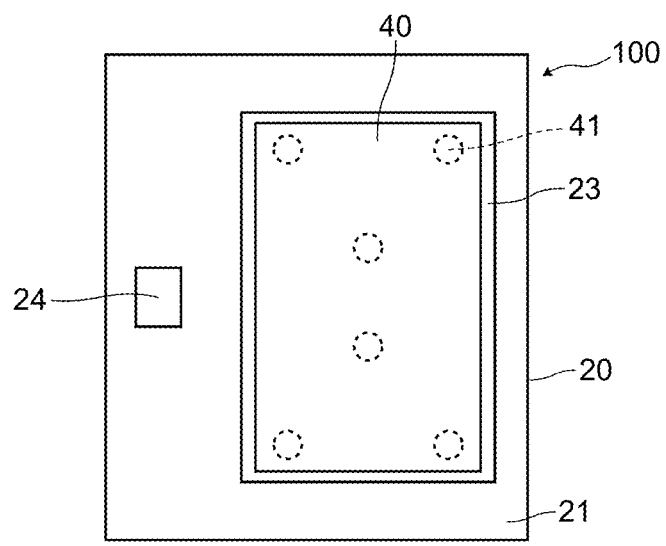

FIG. 1A and FIG. 1B are views for describing a semiconductor device 100 according to an embodiment 1. FIG. 1A is a schematic cross-sectional view of the semiconductor device 100, and FIG. 1B is an enlarged plan view of a main part of the semiconductor device 100.

The semiconductor device 100 includes a circuit board 10, a semiconductor element 20, a metal frame 30, and a metal plate 40, and the semiconductor device 100 is covered by a mold resin 60 having insulation property (see FIG. 1A). The semiconductor device 100 is a power semiconductor device used for a power control or the like. The semiconductor device 100 is also referred to as a semiconductor module.

The circuit board 10 is a board where a pattern wiring layer 12 is formed on one surface of an insulation board 11. The pattern wiring layer 12 includes: a semiconductor element mounting portion 14 on which the semiconductor element 20 is mounted, and an electrode portion 15 which is connected to a source electrode 23 (surface electrode) of the semiconductor element 20 via the metal frame 30. The pattern wiring layer 12 is connected to an external connection terminals not shown in the drawing.

As the circuit board 10, it is preferable to use a ceramic board having a linear expansion coefficient substantially equal to a linear expansion coefficient of the semiconductor element 20. In this embodiment 1, as the circuit board 10, a DCB board (Direct Copper Bonding board) is used. In the DCB board, the pattern wiring layer 12 is formed on a front surface of an alumina ceramic board, and a heat radiation plate 13 is formed on a back surface of the alumina ceramic board. A suitable board such as a printed circuit board can be also used as the circuit board 10. In this case, it is preferable that a heat radiation member (formed of a plate-like metal layer made of copper, iron, aluminum or the like, for example) is formed on a back surface of the board.

The heat radiation plate 13 or a heat radiation member formed on the back surface of the DCB board is electrically insulated from the semiconductor element 20. However, the heat radiation plate 13 or the heat radiation member may be connected to a ground electrode of an equipment which uses the semiconductor device 100.

The semiconductor element 20 is disposed on the pattern wiring layer 12 (semiconductor element mounting portion 14) of the circuit board 10, and is bonded to the pattern wiring layer 12 via a conductive bonding material (for example, a solder). The semiconductor element 20 is a so-called a power semiconductor element.

The semiconductor element 20 includes a base body 21, a drain electrode 22 which is formed on the base body 21 on a side which faces the circuit board 10, a source electrode 23 which forms a main electrode and is formed on a surface of the base body 21 on a side opposite to the side which faces the circuit board 10, and a gate electrode 24 which forms a sub electrode. The base body 21 is formed of a base body made of a suitable material (for example, silicon, silicon carbide, gallium nitrate or the like).

The metal frame 30 is dispose on a source electrode 23 side of the semiconductor element 20 via a conductive bonding material 52, the metal plate 40 described later, and a conductive bonding material 53. With such a configuration, the flow of a main current is not obstructed in a path through which the main current flows and hence, a large current can flow. The metal frame 30 is a clip lead (so-called connector) which is formed by applying blanking, bending or the like to a flat sheet made of metal. One end of the metal frame 30 is electrically connected to the source electrode 23 and the other end of the metal frame 30 is electrically connected to the electrode portion 15 of the circuit board 10 via a conductive bonding material 55.

The gate electrode 24 is bonded to a wiring member 32 via a conductive bonding material 54 (for example, solder) (see FIG. 1A and FIG. 1B). However, a current which flows through the gate current 24 is extremely small compare to a current which flows between the source electrode 23 and the drain electrode 22 and hence, a thickness (cross-sectional area) of the wiring member 32 may be smaller than a thickness (cross-sectional area) of the metal frame 30, or a metal plate may not be interposed between the gate electrode 24 and the wiring member 32. As the wiring member 32, a clip lead may be used or a wire may be used.

The metal plate 40 is a flat plate like member disposed between the metal frame 30 and the source electrode 23. The metal plate 40 is disposed at the position which corresponds to the source electrode 23 (the position at which the metal plate 40 and the source electrode 23 overlap with each other when the semiconductor device 100 is viewed in a direction perpendicular to the circuit board 10).

The conductive bonding materials 52, 53 (for example, solders) are disposed between the metal plate 40 and the source electrode 23 and between the metal plate 40 and the metal frame 30 respectively. The metal plate 40 and the conductive bonding materials 52, 53 form a stress relaxing structure. The stress relaxing structure is described later.

The metal plate 40 is formed of an elastic member. A thickness of the metal plate 40 is smaller than a thickness of the metal frame 30. A plurality (six) convex portions 41 are formed on the metal plate 40 at the position on a source electrode 23 side which corresponds to the source electrode 23.

The metal plate 40 is formed in a rectangular shape as viewed in a plan view, one convex portion 41 is formed on areas in the vicinity of corner portions of a rectangular shape respectively. Two convex portions 41 are formed on a center portion of the metal plate 40 with a suitable distance therebetween (in a well-balanced manner). By forming three or more convex portions 41 on the metal plate 40, in manufacturing steps, the metal plate 40 can be stably disposed on the semiconductor element 20 when the metal plate 40 is disposed on the semiconductor element 20 with the convex portions 41 extending downward.

As described above, according to the embodiment 1, in place of the metal frame 30 having a large thickness so that the formation of small convex portions is difficult, the convex portions are formed on the metal plate 40 which is thin compared to the metal frame 30. Accordingly, a distance between the semiconductor element 20 and the metal frame 40 can be maintained at a fixed value or more without forming the convex portions on the metal frame 30.

Assuming the thickness of the metal frame 30 as t2, a thickness of a region of the metal plate 40 where the convex portions 41 are formed as t12, and a thickness of a region of the metal plate 40 where the convex portions 41 are not formed as t1, a relationships $t1<t2$, $t12<t2$ are satisfied. Further, assuming a height of the convex portion as t11 (=t12-t1), a relationship of $t11<t1$ is satisfied. For example, a relationship of $t11<0.5 \times t1$ is satisfied.

As viewed in a plan view, an area of the metal plate 40 is smaller than an area of the semiconductor element. More specifically, the area of the metal plate 40 is smaller than an area of the semiconductor element where the source electrode 23 is formed.

The metal plate 40 is disposed symmetrically with respect to the center of the source electrode 23, that is, the metal plate 40 is disposed maintaining a flat plate shape without being bent. Further, the convex portions 41 are also disposed at positions symmetrical with respect to bisectors perpendicular to respective sides of the metal plate 40.

2. Stress Relaxation Structure

Before describing the stress relaxation structure, a stress applied to the metal plate 40 and the conductive bonding materials 52, 53 between the metal frame 30 and the semiconductor element 20 is described.

Figure 2:
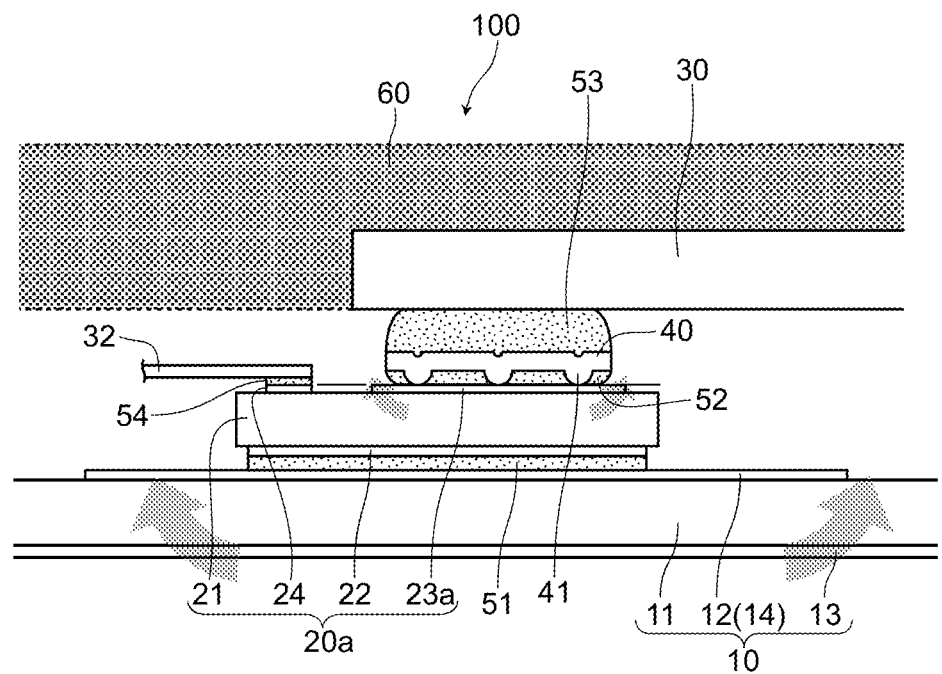
FIG. 2 is a view for describing a stress applied to a conductive bonding material and a metal plate disposed between a metal frame and a semiconductor element.

FIG. 2 is a view for describing a stress applied to the conductive bonding material and the metal plate between the metal frame and the semiconductor element.

With respect to an electric equipment on which the semiconductor device 100 is mounted, there may be a case where an environmental temperature is increased depending on an in-use environment. Particularly, in the electronic equipment which uses a large current estimated in the present invention, parts around the electronic equipment are liable to generate heat thus giving rise to a tendency that a high-temperature environment is brought about.

In such a case, a stress is applied in a direction that the circuit board 10 warps (see FIG. 2). In such a situation, in the semiconductor device 100, a difference in linear expansion coefficient is large between the semiconductor element 20 (silicon, silicon carbide or the like) and the metal frame 30 (copper) and hence, a largest stress is applied to the conductive bonding materials 52, 53 and the metal plate 40 between the semiconductor element 20 and the metal frame 30. Such a stress becomes a cause of a drawback such as a phenomenon that cracks easily occurs in the conductive bonding material or a phenomenon that the conductive bonding material and the metal frame (or the semiconductor element) are easily peeled off from each other.

To relax such a stress, in the semiconductor device 100 according to this embodiment 1, the metal plate 40 and the conductive bonding materials 52, 53 form a stress relaxation structure which relaxes a stress applied to the metal plate 40 and the conductive bonding materials 52, 53 between the metal frame 30 and the semiconductor element 20.

The stress relaxation structure is configured such that the thickness of the metal plate 40 is smaller than the thickness of the metal frame 30, at least one (six) convex portions are formed on the metal plate 40 at a position which corresponds to the source electrode 23 on the metal plate 40, and the convex portions are formed on a surface of the metal plate 40 on a source electrode 23 side. With such a configuration, it is possible to ensure a distance amounting to at least a height of the convex portions 41 by the convex portions 41, and a thickness of the conductive bonding material 52 can be set to a fixed value or more. Further, a distance between the metal frame 30 and the semiconductor element 20 can be set relatively large. Accordingly, even when the conductive bonding materials in a state where the conductive bonding materials sandwich the metal plate 40 are made relatively thick, the conductive bonding materials minimally collapse and hence, a stress of the conductive bonding material can be relaxed in a state where high reliability is ensured.

Further, the stress relaxation structure is configured such that the metal plate 40 is formed of an elastic member and hence, the metal plate 40 per se is deformed so that a stress of the metal plate 40 can be relaxed.

3. Advantageous Effects Acquired by Semiconductor Device 100 According to Embodiment 1

According to the semiconductor device 100 of this embodiment 1, the stress relaxation structure is configured such that at least one convex portion 41 is formed on the metal plate 40 at the position which corresponds to the main electrode (source electrode 23). Accordingly, it is possible to ensure the distance amounting to at least the height of the convex portions 41 between the metal plate 40 and the source electrode 23 by the convex portions 41, and the distance between the region of the metal plate 40 where the convex portions 41 are not formed and the source electrode 23 can be set to a fixed value or more. Accordingly, the thickness of the conductive bonding material 52 disposed between the region of the metal plate 40 where the convex portions 41 are not formed and the source electrode 23 can be set to a fixed value or more. As a result, a stress (for example, a thermal stress) applied to the conductive bonding materials 52, 53 and the metal plate 40 between the semiconductor element 20 and the metal frame 30 can be relaxed.

According to the semiconductor device 100 of this embodiment 1, the stress relaxation structure is configured such that the thickness of the metal plate 40 is smaller than the thickness of the metal frame 30, and at least one convex portion 41 is formed on the metal plate 40 at the position which corresponds to the source electrode and hence, it is unnecessary to form the convex portion by working the metal frame having a relatively large thickness. Accordingly, the convex portion which corresponds to the fine main electrode of the semiconductor element 20 can be formed using the metal plate which has a smaller thickness than the thickness of the metal frame and to which fine working can be easily applied. Particularly, when the metal plate is so thin that the convex portion can be formed by embossing, the convex portion 41 can be easily formed by embossing the metal plate 40 on which the convex portion 41 is formed.

In general, in ensuring a high withstand voltage, to ensure an insulation distance (to prevent short-circuiting between the metal frame and the circuit board), it is necessary to set a thickness of a conductive bonding material relatively large. When a whole gap between the metal frame and the main electrode is filled with conductive bonding material (see a distance t3 in FIG. 1A and FIG. 1B) in a state where convex portion is not formed on a metal frame or when only a convex portion having a considerably short compared to a distance between a metal frame and a main electrode is formed on the metal frame, in manufacturing steps, when the metal frame is disposed on the conductive bonding material, there is a concern that the conductive bonding material collapses and hence, it is difficult to enhance reliability of the semiconductor device.

On the other hand, the semiconductor device 100 according to the embodiment 1 includes the metal plate 40 having a flat plate shape disposed between the metal frame 30 and the source electrode 23 and hence, it is unnecessary to fill the whole gap between the metal frame 30 and the source electrode 23 with a conductive bonding material. Accordingly, in manufacturing steps, when the metal frame 30 is disposed on the conductive bonding material 53, it is possible to prevent the conductive bonding material from collapsing and hence, reliability of the semiconductor device is minimally lowered. Further, the stress relaxation structure is configured such that at least one convex portion 41 is formed on the metal plate 40 at the position which corresponds to the source electrode 23. Accordingly, even in the case where a distance between the metal frame 30 and the source electrode 23 is increased, it is possible to easily maintain a predetermined distance between the metal plate 40 and the source electrode 23 (see symbol t11 in FIG. 1A) and hence, it is unnecessary to excessively increase a thickness of the conductive bonding material 53 between the metal plate 40 and the metal frame 30 and hence, the conductive bonding material minimally collapses and hence, reliability of the semiconductor device is minimally lowered.

According to the semiconductor device 100 of the embodiment 1, the stress relaxation structure is configured such that the thickness of the metal plate 40 is smaller than the thickness of the metal frame 30 and hence, the metal plate per se is deformed whereby a stress (for example, a thermal stress) applied to the conductive bonding materials 52, 53 and the metal plate 40 between the semiconductor element 20 and the metal frame 30 can be absorbed. As a result, a stress (for example, a thermal stress) applied to the conductive bonding materials 52, 53 and the metal plate 40 between the semiconductor element 20 and the metal frame 30 can be further relaxed. Further, the stress relaxation structure is configured such that the thickness of the metal plate 40 is smaller than the thickness of the metal frame 30, and at least one convex portion 41 is formed on the metal plate 40 at the position which corresponds to the source electrode 23. Accordingly, a thickness of the conductive bonding material 52 disposed between the region of the metal plate 40 where the convex portion 41 is not formed and the source electrode 23 can be set to a fixed value or more. Accordingly, in addition to the absorption of a stress brought about by deformation of the metal plate 40 per se, it is possible to absorb a stress which cannot be absorbed by deformation of the metal plate also by the conductive bonding material 52 disposed between the region of the metal plate 40 where the convex portion 41 is not formed and the source electrode 23. As a result, a stress (for example, a thermal stress) applied to the conductive bonding materials 52, 53 and the metal plate 40 between the semiconductor element 20 and the metal frame 30 can be further relaxed.

Further, according to the semiconductor device 100 of the embodiment 1, the stress relaxation structure is configured such that at least one convex portion 41 is formed on the metal plate 40 at the position which corresponds to the source electrode 23, and bonding is performed by collecting the conductive bonding material 52 about a portion of the convex portion 41 of the metal plate 40 and hence, it is possible to bond the electrode and the metal plate with certainty by using such a portion as an initiation point from which solder spreads by wetting. Further, a cutout is formed in the metal plate so as to avoid the sub electrode and hence, spreading by wetting of the solder toward the sub electrode can be suppressed and hence, a possibility that short-circuiting occurs between the main electrode and the sub electrode becomes small.

Further, according to the semiconductor device 100 of the embodiment 1, the stress relaxation structure is configured such that the metal plate 40 is formed of an elastic member. Accordingly, the metal plate 40 per se is easily elastically deformed and hence, a stress can be more easily absorbed.

According to the semiconductor device 100 of the embodiment 1, the metal plate 40 is disposed symmetrically with respect to the center of the source electrode 23 and hence, the metal plate 40 can be stably disposed on the source electrode 23. Accordingly, in manufacturing steps, the metal plate 40 is minimally inclined and hence, a thickness of the conductive bonding material 52 between the metal plate 40 and the source electrode 23 can be easily maintained at a fixed value. As a result, the semiconductor device 100 can maintain high reliability.

According to the semiconductor device 100 of the embodiment 1, the source electrode 23 which forms the main electrode and the gate electrode 24 which forms the sub electrode are formed on a surface of the semiconductor element 20 on a side opposite to a side which faces the circuit board 10, and the drain electrode 22 is formed on a circuit board 10 side. Accordingly, the semiconductor device 100 according to the embodiment 1 becomes a semiconductor device suitable for electronic equipment which uses a large current.

According to the semiconductor device 100 of the embodiment 1, the circuit board 10 uses a ceramic board (alumina ceramic board) and hence, a difference in linear expansion coefficient between the circuit board 10 and the semiconductor element 20 is small whereby a stress is minimally applied to the conductive bonding material 52 between the semiconductor element 20 and the circuit board 10.

According to the semiconductor device 100 of the embodiment 1, as viewed in a plan view, the area of the metal plate 40 is smaller than the area of the semiconductor element 20 and hence, a state is brought about where the entire metal plate 40 is place on the conductive bonding material 52. Accordingly, in manufacturing steps, the metal plate 40 can be bonded while maintaining stability in solder reflow and hence, mounting displacement minimally occurs.

Embodiment 2

Figure 3:
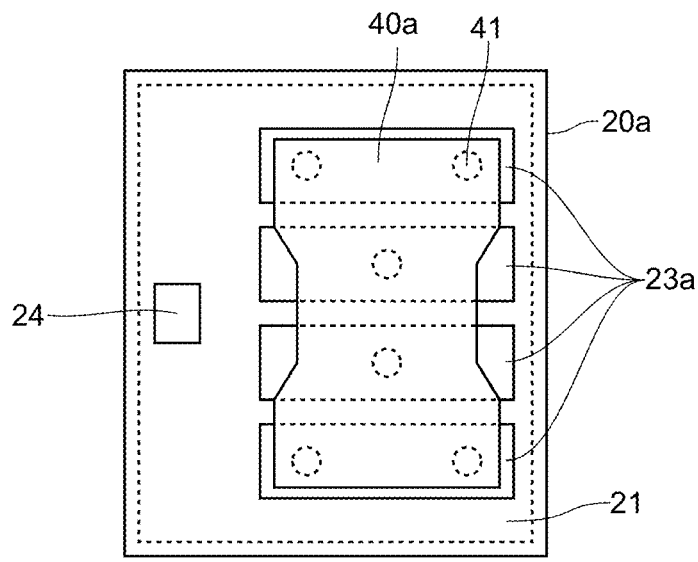
FIG. 3 is an enlarged plan view of a main part for describing a semiconductor device 100a according to an embodiment 2.
Figure 4:
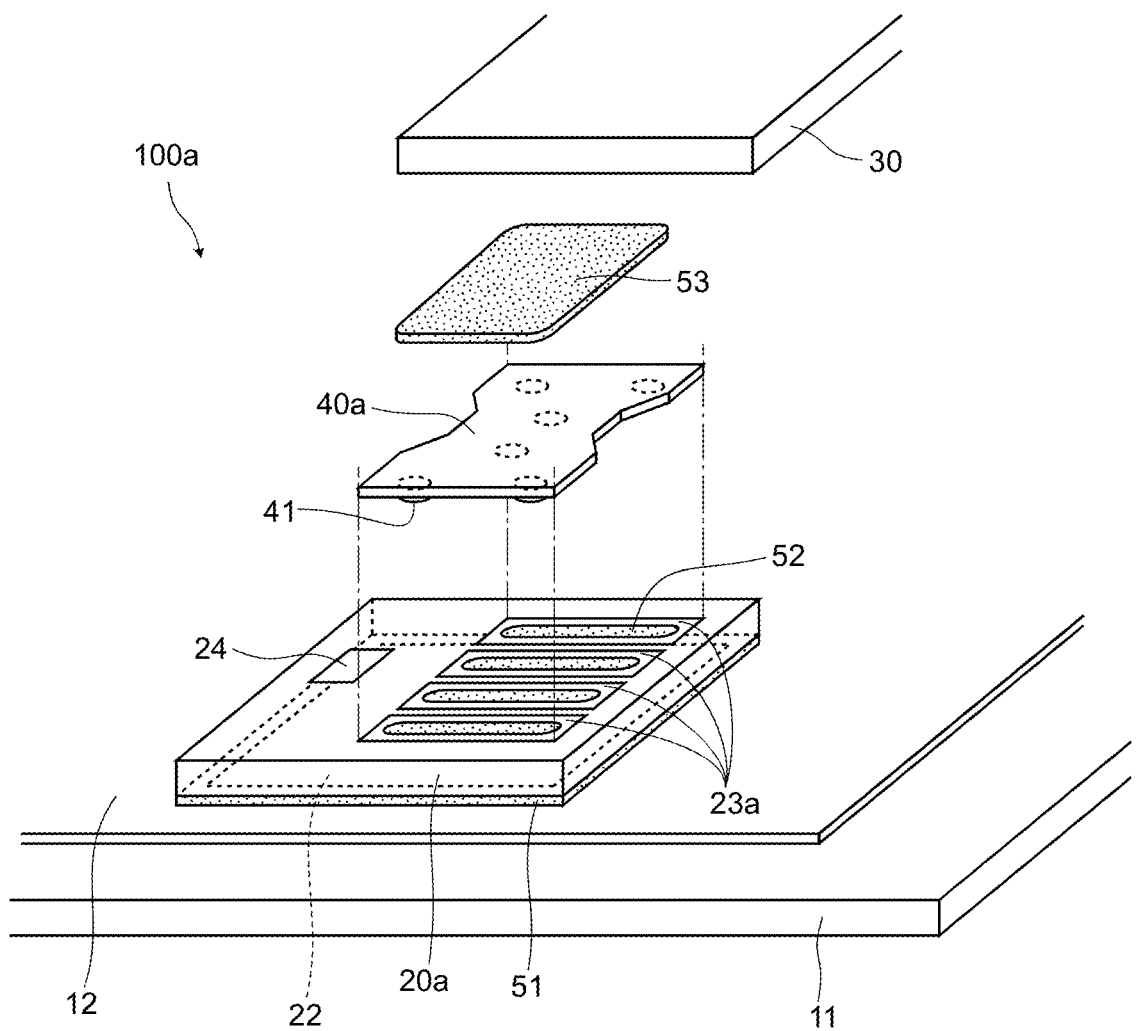
FIG. 4 is an exploded view of a semiconductor element and the surrounding of the semiconductor element 20 according to the embodiment 2.

FIG. 3 is an enlarged plan view of a main part for describing a semiconductor device 100a according to an embodiment 2. FIG. 4 is an exploded view of a semiconductor element 20 and the surrounding of the semiconductor element 20 according to the embodiment 2.

The semiconductor device 100a according to the embodiment 2 has basically substantially the same configuration as the semiconductor device 100 according to the embodiment 1. However, the semiconductor device 100a according to the embodiment 2 differs from the semiconductor device 100 according to the embodiment 1 with respect to the configuration of a main electrode. That is, in the semiconductor device 100a according to the embodiment 2, a source electrode 23a has a plurality of regions, and a stress relaxation structure is configured such that convex portions 41 are formed on a metal plate 40 at positions which respectively correspond to the plurality of regions of the source electrode 23.

The source electrode 23a is formed of the plurality of regions, that is, four regions having a rectangular shape. Although the regions are respectively isolated from each other by an insulation layer, a groove or the like on a surface of the source electrode 23a, these regions are conductive with each other in the source electrode 23a.

A metal plate 40a is disposed so as to overlap with the source electrode 23a as viewed in a plan view, and the metal plate 40a is formed so as to cover a most portion of the source electrode 23a. The metal plate 40a has a rectangular shape as a whole, and a cutout is formed on a side of the metal plate 40a on a gate side and a side of the metal plate 40a opposite to the side on the gate side (see FIG. 3).

The metal plate 40a is formed on a side which faces the source electrode 23a and at a position which corresponds to the source electrode 23, to be more specific, the metal plate 40a is formed at a position which corresponds to the plurality of regions of the source electrode 23a. With respect to the plurality of regions of the source electrode 23, two convex portions (one for an area in the vicinity of each end portion) are formed in regions of the metal plate 40a which correspond to the regions of the source electrode 23 away from the gate electrode 24 (regions where the cutout are not formed). With respect to the plurality of regions of the source electrode 23, one convex portion is formed in center portions of the regions of the metal plate 40a which correspond to the regions of the source electrode 23 near the gate electrode 24 (regions where the cutouts are formed).

In the embodiment 2, as shown in FIG. 4, a conductive bonding material (for example, a solder) is placed on the respective regions of the source electrode 23a using a dispenser or the like, the metal plate 40a is disposed on the conductive bonding material, a conductive bonding material 53 is placed on the metal plate 40a, and a metal frame 30 is placed on the conductive bonding material 53.

In this manner, the semiconductor device 100a according to the embodiment 2 differs from the semiconductor device 100 according to the embodiment 1 with respect to the configuration of the main electrode. However, in the same manner as the semiconductor device 100 according to the embodiment 1, the stress relaxation structure is configured such that at least one convex portion 41 is formed on the metal plate 40a at the position which corresponds to the main electrode (source electrode) 23a. Accordingly, it is possible to ensure the distance amounting to at least the height of the convex portions 41 between the metal plate 40a and the source electrode 23a by the convex portions 41, and the distance between the region of the metal plate 40a where the convex portions 41 are not formed and the source electrode 23a can be set to a fixed value or more. Accordingly, the thickness of the conductive bonding material 52 disposed between the region of the metal plate 40a where the convex portions 41 are not formed and the source electrode 23a can be set to a fixed value or more. As a result, a stress (for example, a thermal stress) applied to the conductive bonding materials 52, 53 and the metal plate 40a between the semiconductor element 20 and the metal frame 30 can be relaxed.

In the semiconductor device 100a according to the embodiment 2, the source electrode 23a has the plurality of regions. Accordingly, compared to a case where the source region is formed of a single region (for example, the source region being formed of a center portion and a peripheral portion of the source electrode), the deviation of current distribution minimally occurs and hence, a current can be made uniform. Further, such a source electrode 23a has an effect of dispersing a stress applied to the conductive bonding material between the metal plate 40a and the source electrode 23a and hence, a thermal stress can be easily relaxed.

In the semiconductor device 100a according to the embodiment 2, the source electrode 23a has a plurality of regions, and the stress relaxation structure is configured such that the convex portions 41 are formed on the metal plate 40a at positions which correspond to the plurality of regions of the source electrode 23a respectively and hence, the structure is adopted where, in the respective regions of the source electrode 23a, the conductive bonding materials 52 are collected and bonded to the convex portions 41. Accordingly, the metal plate 40a and the respective regions of the source electrode 23a can be connected to each other with certainty and hence, it is possible to make a large current flow through the semiconductor device 100a more easily. The convex portions 41 are formed on the metal plate 40a at positions which correspond to the respective regions of the source electrode 23a and hence, a thickness of the conductive bonding material 52 between the respective regions and the metal plate 40a can be set to a fixed value or more. Accordingly, a stress (for example, a thermal stress) applied to the conductive bonding materials 52, 53 between the semiconductor element 20 and the metal frame 30 can be relaxed, and further, reliability of the semiconductor device can be enhanced.

In the semiconductor device 100a according to the embodiment 2, the plurality of regions of the source electrode 23a are respectively independently formed and hence, the conductive bonding material 52 is collected and bonded about the convex portion 41 in the respective regions. Accordingly, the conductive bonding materials 52, 53 can be formed with a large thickness between the source electrode 23a and the metal frame 30 and hence, reliability of the semiconductor device can be enhanced.

In the semiconductor device 100a according to the embodiment 2, a cutout is formed in the metal plate 40a so as to avoid the gate electrode 24. Accordingly, a distance between the metal plate 40a and the gate electrode 24, eventually, a distance between the conductive bonding materials 52, 53 and the gate electrode 24 can be set to a fixed value or more. As a result, it is possible to prevent short-circuiting between the source electrode 23a and the gate electrode 24.

The semiconductor device 100a according to the embodiment 2 has substantially the same configuration as the semiconductor device 100 according to the embodiment 1 with respect to points other than the configuration of the source electrode and hence, the semiconductor device 100a according to the embodiment 2 acquires the corresponding advantageous effects found amongst all advantageous effects which the semiconductor device 100 according to the embodiment 1 acquires.

Modification (Application Example)

Figure 5A:
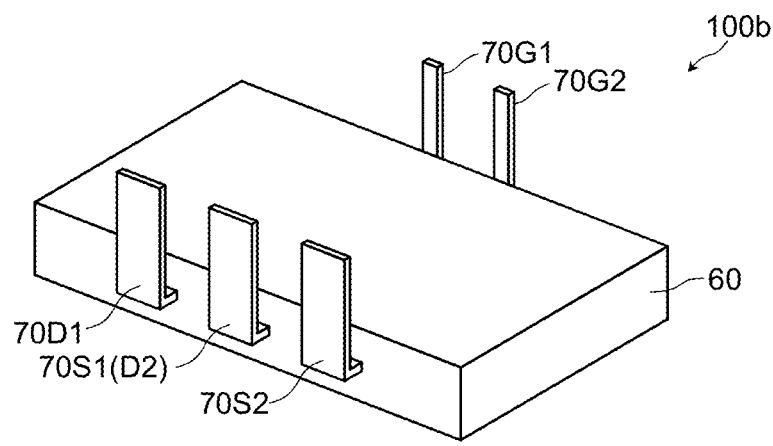
FIG. 5A and FIG. 5B are views for describing a semiconductor device 100b according to a modification.
Figure 5B:
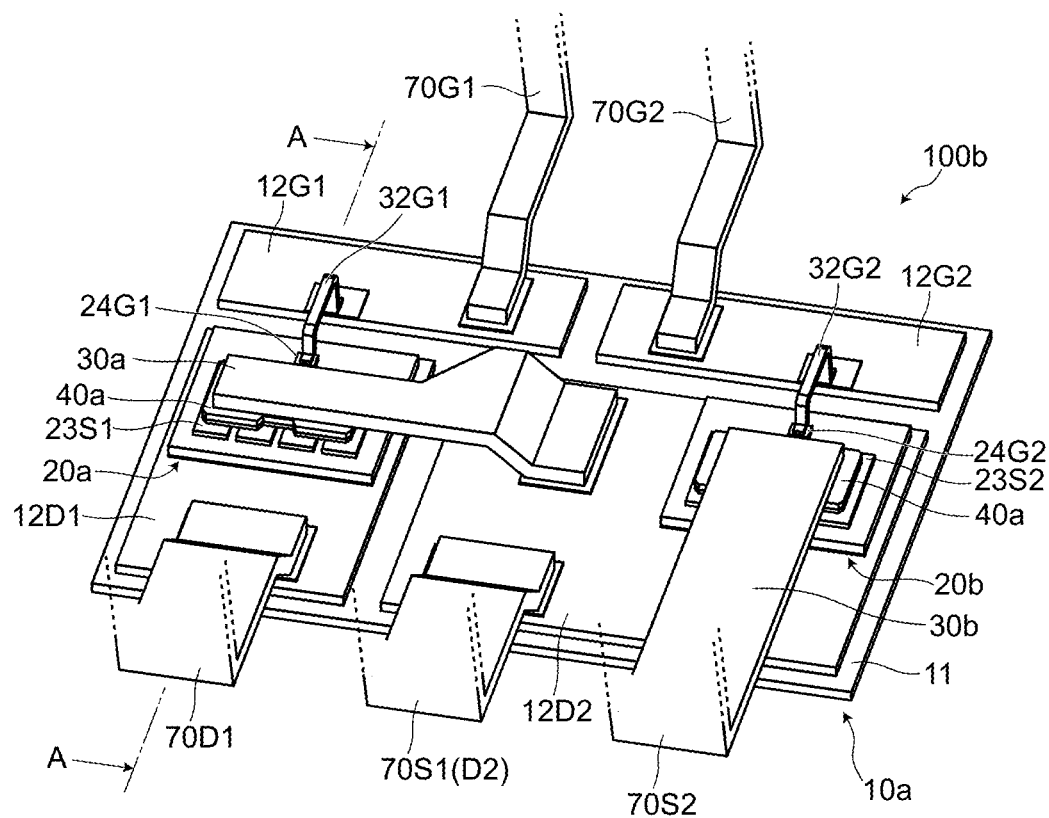
Figure 6:
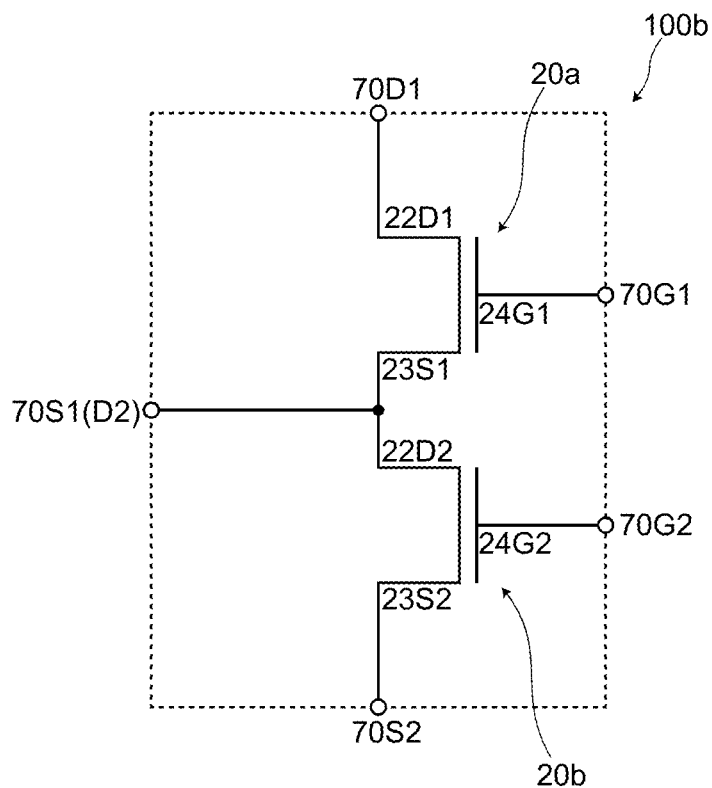
FIG. 6 is a circuit diagram of the semiconductor device 100b according to the modification.
Figure 7:
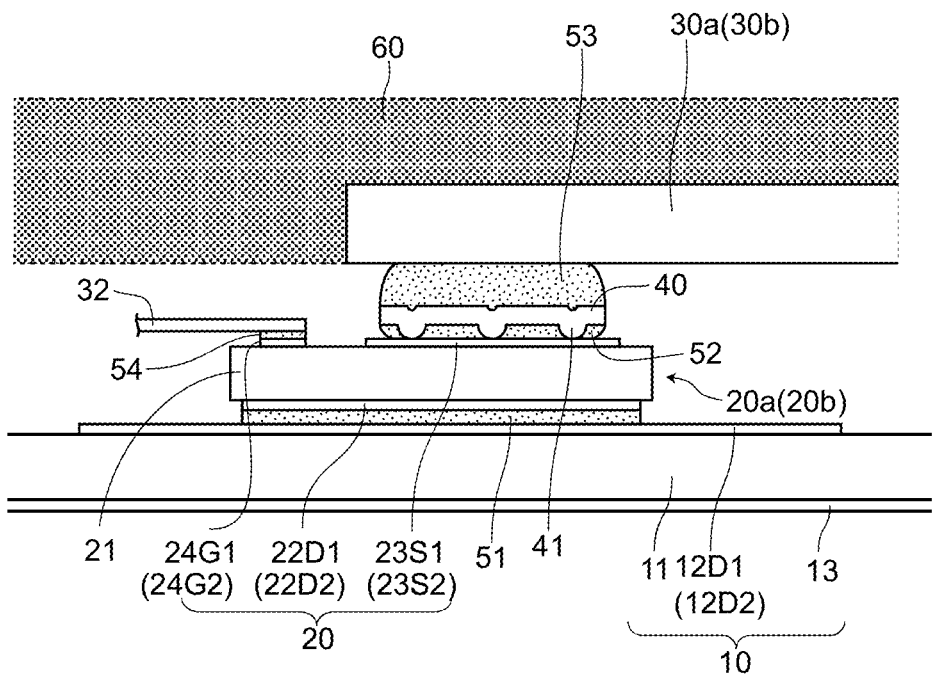
FIG. 7 is an enlarged cross-sectional view of a main part of the semiconductor device 100b according to the modification.

FIG. 5A and FIG. 5B are views for describing a semiconductor device 100b according to a modification. FIG. 5A is a perspective view showing an external appearance of the semiconductor device 100b, and FIG. 5B is a view showing an internal structure of the semiconductor device 100b. In FIG. 5B, illustration of a mold resin 60 is omitted. FIG. 6 is a circuit diagram of the semiconductor device 100b according to the modification. FIG. 7 is a schematic cross-sectional view of the semiconductor device 100b according to the modification.

The semiconductor device 100b according to the modification has basically substantially the same configuration as the semiconductor device 100a according to the embodiment 2. However, in the semiconductor device 100b according to the modification, a plurality of semiconductor elements are mounted on a circuit board 10a, and metal plates 40 are disposed between respective source electrodes (main electrode) 23S1, 23S2 of the semiconductor elements and metal frames 30a, 30b. That is, in the semiconductor device 100b according to the modification, as the semiconductor elements, two semiconductor elements consisting of a semiconductor element 20a and a semiconductor element 20b are incorporated (see FIG. 5B and FIG. 6).

First, the external appearance of the semiconductor device 100b according to the modification is described.

The semiconductor device 100b according to the modification is sealed by the mold resin 60, and five terminals (70D1, 70S2, 70S1 (D2), 70G1, 70G2) for electrical connection with an external circuit are exposed to the outside of the mold resin 60 (see FIG. 5A). Heat radiation members (not shown in the drawings) are also exposed to the outside of the mold resin 60 for increasing a heat radiation effect. The terminals 70D1, 70S2, 70S1 (D2) which form main current paths respectively have a large cross-sectional area to allow a large current to flow through these terminals. In the semiconductor device 100b according to the modification, the respective terminals are bent toward a surface side (a semiconductor element mounting surface side) when the metal frames extending from the inside is viewed from a circuit board 10a.

Next, the internal structure of the semiconductor device 100b according to the modification is described.

In the semiconductor device 100b according to the modification, the semiconductor element 20a and the semiconductor element 20a are connected in series, and a source electrode 23S1 of the semiconductor element 20a and a drain electrode 22D1 of the semiconductor element 20b are connected to each other (see FIG. 6).

The circuit board 10a has, as a pattern wiring layer, pattern wiring layers 12D1, 12D2, 12G1, and 12G2 (see FIG. 5B).

The semiconductor element 20a has a drain electrode 22D1 on one surface side, and has the source electrode 23S1 and a gate electrode 24G1 on the other surface side. The semiconductor element 20b has the drain electrode 22D2 on one surface side, and has the source electrode 23S2 and a gate electrode 24G2 on the other surface side (see FIG. 5B).

In the semiconductor element 20a, the drain electrode 22D1 is placed on the pattern wiring layer 12D1 such that the drain electrode 22D1 faces the pattern wiring layer 12D1. In the semiconductor element 20b, the drain electrode 22D2 is placed on the pattern wiring layer 12D2 such that the drain electrode 22D2 faces the pattern wiring layer 12D2.

The terminal 70D1 is connected to the drain electrode 22D1 of the semiconductor element 20a via the pattern wiring layer 12D1.

The terminal 70G1 is electrically connected to the gate electrode 24G1 of the semiconductor element 20a via a wiring member 32G1 and the pattern wiring layer 12G1.

The terminal 70S1 (D2) is connected to the source electrode 23S1 of the semiconductor element 20a via the pattern wiring layer 12D2 and the metal frame 30a. The terminal 70S1 (D2) is also connected to the drain electrode 22D2 of the semiconductor element 20b via the pattern wiring layer 12D2.

The terminal 70G2 is electrically connected to the gate electrode 24G2 of the semiconductor element 20b via a wiring member 32G2 and the pattern wiring layer 12G2.

The terminal 70S2 is formed by bending an end portion of the metal frame 30b, and is connected to the source electrode of the semiconductor element 20b.

The metal frame 30a is a clip lead (so-called connector) which connects the semiconductor element 20a and the pattern wiring layer 12D2 to each other. In the same manner as the case of the embodiment 2, the semiconductor device 100b includes the metal plate 40 having a flat plate shape which is disposed between the metal frame 30a and the source electrode 23S1 (see FIG. 7). A conductive bonding material 52 is disposed between the metal plate 40 and the source electrode 23S1 and between the metal plate 40 and the metal frame 30a. The metal plate 40a and the conductive bonding material 52 form a stress relaxation structure which relaxes a stress applied to the metal plate 40a and the conductive bonding material 52 between the metal frame 30a and the semiconductor element 20a.

The metal frame 30b is a metal frame having one end which is connected to the source electrode 23S2 of the semiconductor element 20b and the other end which forms the terminal 70S2. In the same manner as the embodiment 2, the semiconductor device 100b includes the metal plate 40 having a flat plate shape which is disposed between the metal frame 30b and the source electrode 23S2 (see FIG. 7 with respect to such a configuration). The conductive bonding material 52 is disposed between the metal plate 40 and the source electrode 23S2 and between the metal plate 40 and the metal frame 30b. The metal plate 40b and the conductive bonding material 52 form a stress relaxation structure which relaxes a stress applied to the metal plate 40b and the conductive bonding material 52 between the metal frame 30b and the semiconductor element 20b.

The semiconductor device 100b according to the modification has substantially the same configuration as the semiconductor device 100a according to the embodiment 2 with respect to points other than the point that, as the semiconductor element, two semiconductor elements consisting of the semiconductor element 20a and the semiconductor element 20b are incorporated. Accordingly, the semiconductor device 100b according to the modification acquires the corresponding advantageous effects found amongst all advantageous effects which the semiconductor device 100a according to the embodiment 2 acquires.

Embodiment 3

Figure 8A:
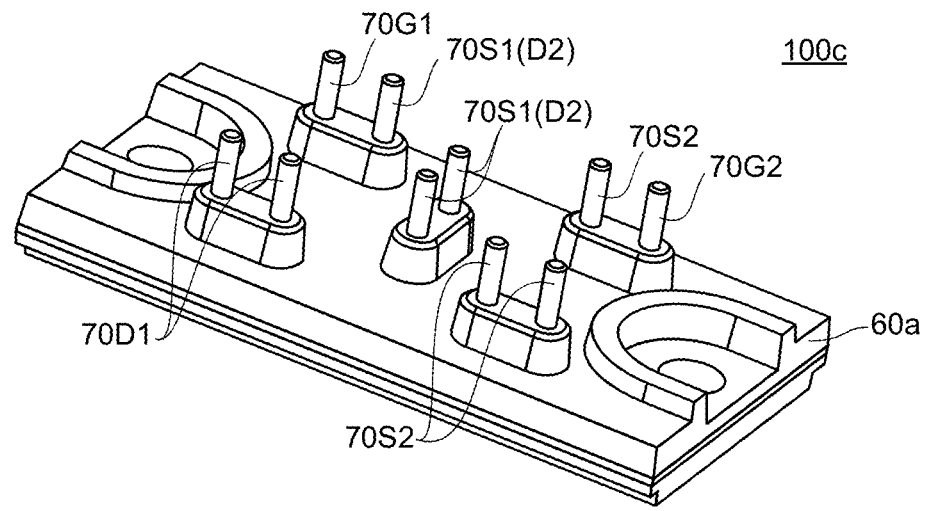
FIG. 8A and FIG. 8B are views for describing a semiconductor device 100c according to an embodiment 3.
Figure 8B:
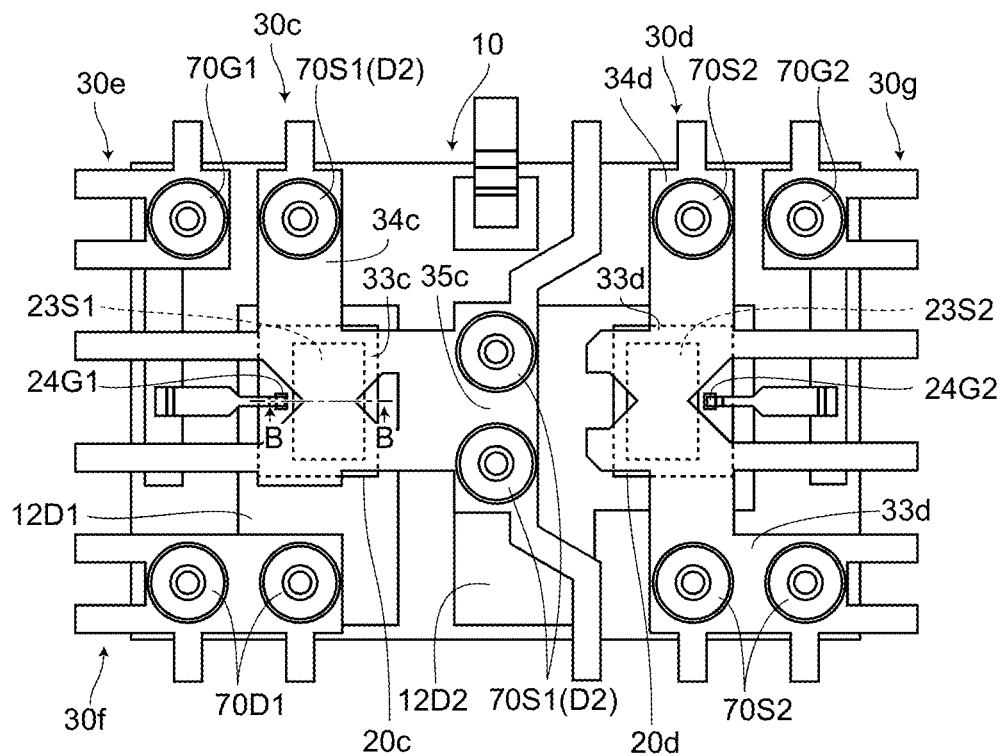
Figure 9:
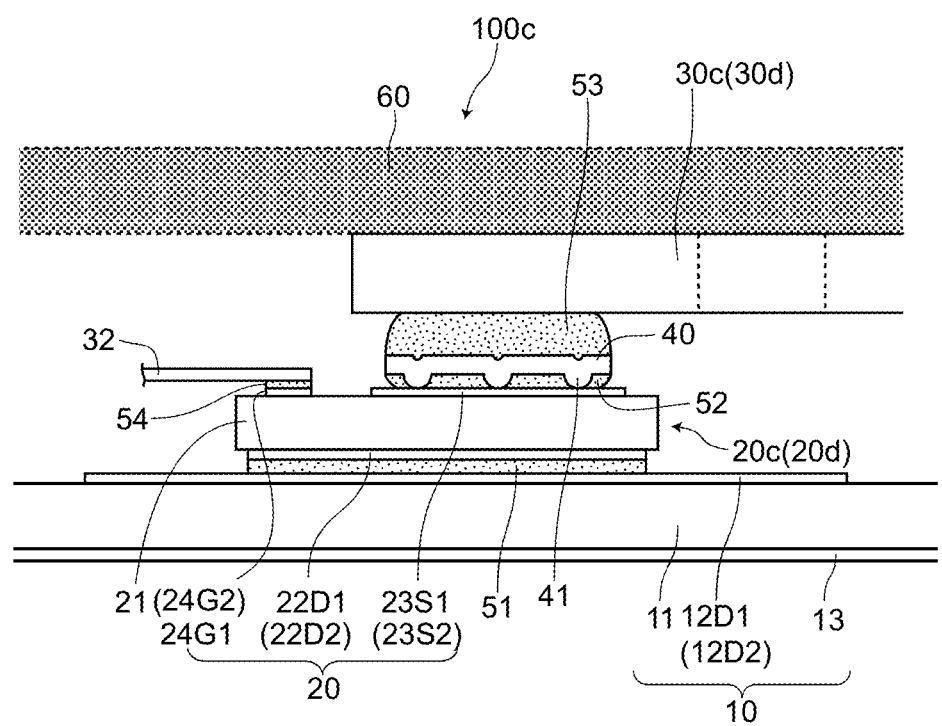
FIG. 9 is an enlarged cross-sectional view of a main part according to the semiconductor device 100c according to the embodiment 3.

FIG. 8A and FIG. 8B are views for describing a semiconductor device 100c according to an embodiment 3. FIG. 8A is a perspective view of the semiconductor device 100c, and FIG. 8B is a plan view showing the internal configuration of the semiconductor device 100c. In FIG. 8B, for the sake of brevity, the illustration of a mold resin 60a is omitted. FIG. 9 is an enlarged cross-sectional view of a main part of the semiconductor device 100c according to the embodiment 3 (cross-sectional view taken along a line B-B in FIG. 8B).

The semiconductor device 100c according to the embodiment 3 has basically substantially the same configuration as the semiconductor device 100b according to the modification. However, the semiconductor device 100c according to the embodiment 3 differs from the semiconductor device 100b according to the modification with respect to the configuration of a connecting member, a metal frame, and external terminals. That is, in the semiconductor device 100c according to the embodiment 3, as shown in FIG. 8B, a connection member and a metal frame are formed of leads (lead frames) 30c, 30d, 30e, 30f, 30g all of which have a flat plate shape, and the external terminals are pin terminals which are disposed in a penetrating manner through the leads. One end portion of each pin terminal protrudes to the outside, and the other end portion of the pin terminal is connected to a pattern wiring layer of a circuit board.

The pin terminal is an elongated circular-columnar conductive pin having a flange portion which is a large diameter portion at a center portion of the conductive pin. The pin terminal is used as a terminal for external connection, and also is used as a member which connects the lead and the wiring pattern.

The pin terminals are formed of: the pin terminal 70G1 which is connected to a gate electrode 24G1 of a semiconductor element 20a; the pin terminal 70D1 which is connected to a drain electrode 22D1 of the semiconductor element 20a; the pin terminal 70S1 (D2) which is connected to a source electrode 23S1 of the semiconductor element 20a and a drain electrode 22D2 of a semiconductor element 20b; three pin terminals 70S2 which are connected to a source electrode 23S2 of the semiconductor element 20b; and the pin terminal 70G2 which is connected to a gate electrode 24G2 of the semiconductor element 20b.

As shown in FIG. 8B, the semiconductor device 100c according to the embodiment 3 includes two semiconductor elements 20a, 20b as a semiconductor element. Two semiconductor elements each has: the drain electrode (not shown in the drawing) on a pattern wiring layer 12 side of a circuit board 10; and the source electrodes 23S1, 23S2 and the gate electrodes 24G1, 24G2 on a side opposite to the circuit board 10. Two semiconductor elements 20a, 20b, the pattern wiring layer 12 of the circuit board 10, the leads 30c, 30d and the respective pin terminals form a circuit where two switching elements are connected in series (the circuit configuration being equal to the circuit configuration shown in FIG. 6) via the pin terminals 70S1 (D2).

As shown in FIG. 8B, the lead 30c is disposed on the source electrode 23S1 of the semiconductor element 20a. The lead 30c includes: a first electrode connecting portion 33c which is electrically connected to the source electrode 23S1 of the semiconductor element 20a; a second electrode connecting portion 34c which is connected to a pattern wiring layer 12D1 via the pin terminal 70S1 (D1); and a third electrode connecting portion 35c which is connected to an electrode portion of a pattern wiring layer (not shown in the drawings).

As shown in FIG. 8B, the lead 30d is disposed on the source electrode 23S2 of the semiconductor element 20b. The lead 30d includes: a first electrode connecting portion 33d which is electrically connected to the source electrode 23S2 of the semiconductor element 20b via a conductive bonding material; and two second electrode connecting portions 34d which are connected to the pattern wiring layer 12S2 via the pin terminals 70S2.

A stress relaxation structure is configured such that at least one convex portion 41 is formed on the metal plate 40 at a position which corresponds to the source electrodes 23S1, 23S2 (see FIG. 9).

In this manner, the semiconductor device 100c according to the embodiment 3 differs from the semiconductor device 100b according to the modification with respect to the configuration of the connecting members and the external terminals. However, in the same manner as the case of the semiconductor device 100c according to the modification, the stress relaxation structure is configured such that at least one convex portion 41 is formed on the metal plate 40 at the position which corresponds to the source electrode 23S1, 23S2. Accordingly, it is possible to ensure the distance amounting to at least the height of the convex portion 41 between the metal plate 40 and the source electrodes 23S1, 23S2 by the convex portions 41, and the distance between the region of the metal plate 40 where the convex portions 41 are not formed and the source electrodes 23S1, 23S2 can be set to a fixed value or more. Accordingly, the thickness of the conductive bonding material 52 disposed between the region of the metal plate 40 where the convex portions 41 are not formed and the source electrodes 23S1, 23S2 can be set to a fixed value or more. As a result, a stress (for example, a thermal stress) applied to the conductive bonding materials 52, 53 and the metal plate 40 between the semiconductor element 20 and the metal frames 30c, 30d can be relaxed.

Further, the semiconductor device 100c according to the embodiment 3 further includes: the pin terminals 70S1 (D2), 70S2 which are disposed in a penetrating manner through the metal frames 30c, 30d. One end portion of the pin terminal protrudes to an outside and the other end portion of the pin terminal is connected to the pattern wiring layer 12 of the circuit board 10. With such a configuration, the metal frames (leads) 30c, 30d are fixed to the circuit board 10 by way of the pin terminals 70S1 (D2), 70S2. Accordingly, even when it is difficult to expect the self-alignment between the metal frames (leads) 30b, 30c, a difference minimally occurs in a thermal shrinking stress applied to the conductive bonding materials 52, 53 and hence, the deviation minimally occurs in the conductive bonding materials. Accordingly, the semiconductor element 20a, 20b are minimally inclined when the conductive bonding materials 52, 53 are solidified (when a solder is aggregated) and hence, a thickness of the conductive bonding material can be maintained at a fixed value whereby it is possible to provide a highly reliable semiconductor device.

According to the semiconductor device 100c of the embodiment 3, the present invention is applicable not only to the case where a clip lead is used as the metal frame (see symbol 30a in FIG. 5B) and the case where a portion of the terminal is used as the metal frame (see symbol 70S2 in FIG. 5B) but also to the case where a lead (lead frame) which connects the electrode of the semiconductor element and the terminal (pin terminal) to each other is used as the metal frame.

The semiconductor device 100c according to the embodiment 3 has substantially the same configuration as the semiconductor device 100b according to the modification with respect to points other than the configuration of the connecting members and the external terminals and hence, the semiconductor device 100c according to the embodiment 3 acquires the corresponding advantageous effects found amongst all advantageous effects which the semiconductor device 100b according to the modification acquires.

Embodiment 4

Figure 10A:
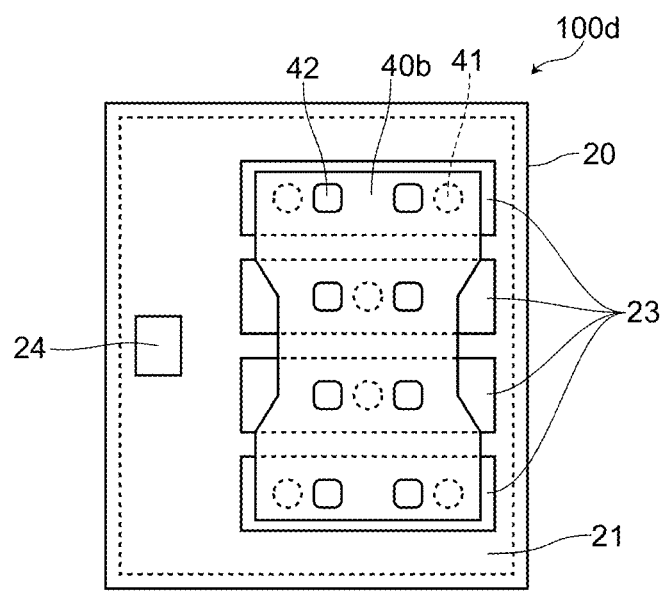
FIG. 10A and FIG. 10B are views for describing a semiconductor device 100d according to an embodiment 4.
Figure 10B:
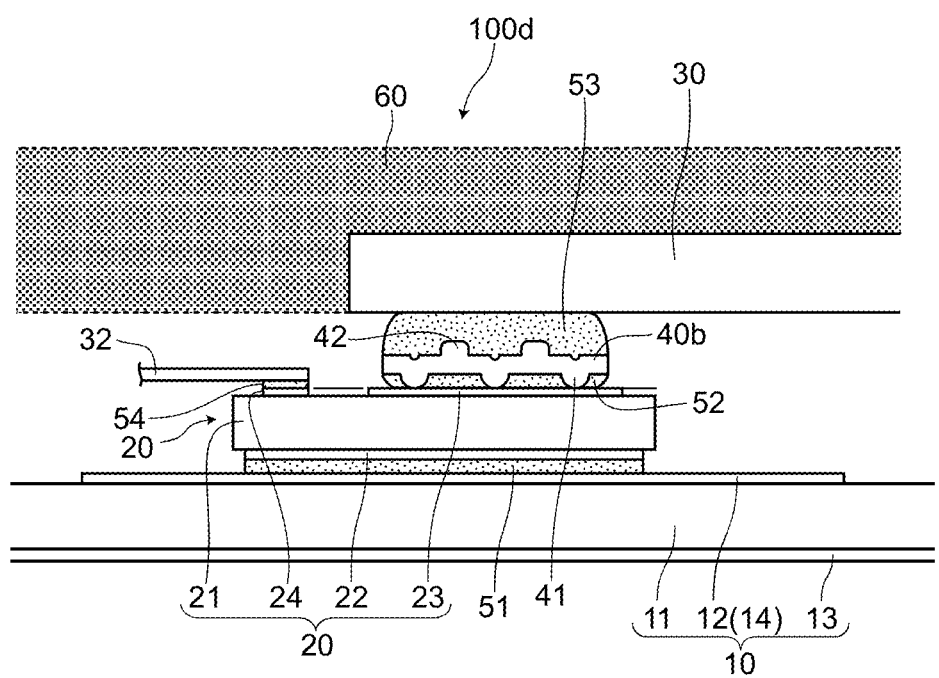

FIG. 10A and FIG. 10B are views for describing a semiconductor device 100d according to an embodiment 4. FIG. 10A is an enlarged plan view of a main part for describing a metal plate 40b, and FIG. 10B is an enlarged cross-sectional view of a main part of the semiconductor device 100d. In these drawings, a mold resin 60 is omitted.

The semiconductor device 100d according to the embodiment 4 has basically substantially the same configuration as the semiconductor device 100a according to the embodiment 2. However, the semiconductor device 100d according to the embodiment 4 differs from the semiconductor device 100a according to the embodiment 2 with respect to the configuration of the metal plate. That is, as shown in FIG. 10A and FIG. 10B, in the semiconductor device 100d according to the embodiment 4, a stress relaxation structure is configured such that a convex portion 41 is formed on a metal plate 40b on a source electrode 23 side, and a convex portion 42 is also formed on the metal plate 40b on a side opposite to the source electrode 23 side (metal frame 30 side). That is, the stress relaxation structure is configured such that the convex portion is formed on both surfaces of the metal plate 40b.

In the embodiment 4, the convex portion 42 has substantially the same height as the convex portion 41. However, the height of the convex portion 42 may be set as desired.

For example, the height of the convex portion 42 may be set to a height which reaches the metal frame 30. In this case, a distance amounting to the height of the convex portion 42 (=a distance between the metal frame 30 and the metal plate 40b) is set to a fixed value or more with certainty. Accordingly, a thickness of a conductive bonding material 53 between the metal plate 40b and the metal frame 30 can be set to a fixed value or more with certainty and hence, a stress applied to the conductive bonding material 53 can be relaxed. The planar arrangement position of the convex portion 42 can be set as desired.

In this manner, the semiconductor device 100d according to the embodiment 4 differs from the semiconductor device 100a according to the embodiment 2 with respect to the configuration of the metal plate. However, in the same manner as the case of the semiconductor device 100a according to the embodiment 2, the stress relaxation structure is configured such that at least one convex portion 41 is formed on the metal plate 40b at the position which corresponds to the source electrode 23. Accordingly, it is possible to ensure a distance amounting to at least a height of the convex portions 41 between the metal plate 40b and the source electrode (main electrode) 23 by the convex portions 41 and hence, a distance between a region of the metal plate 40b where the convex portion 41 is not formed and the source electrode 23 can be set to a fixed value or more. Accordingly, a thickness of the conductive bonding material 52 disposed between the region of the metal plate 40b where the convex portion 41 is not formed and the source electrode 23 can be set to a fixed value or more. As a result, a stress (for example, a thermal stress) applied to the conductive bonding materials 52, 53 and the metal plate 40b between the semiconductor element 20 and the metal frame 30 can be relaxed.

An upper portion of the convex portion 42 may be disposed in the vicinity of the metal frame 30, and a lower portion of the convex portion 41 may be disposed in the vicinity of the source electrode 23. That is, a length from an uppermost portion of the convex portion 42 to an uppermost portion of the convex portion 41 may be set substantially equal to a length between the semiconductor element 20 and the metal frame 30.

The semiconductor device 100d according to the embodiment 4 has substantially the same configuration as the semiconductor device 100a according to the embodiment 2 with respect to points other than the configuration of the connecting member and the external terminals and hence, the semiconductor device 100d according to the embodiment 4 acquires the corresponding advantageous effects found amongst all advantageous effects which the semiconductor device 100a according to the embodiment 2 acquires.

Embodiment 5

Figure 11:
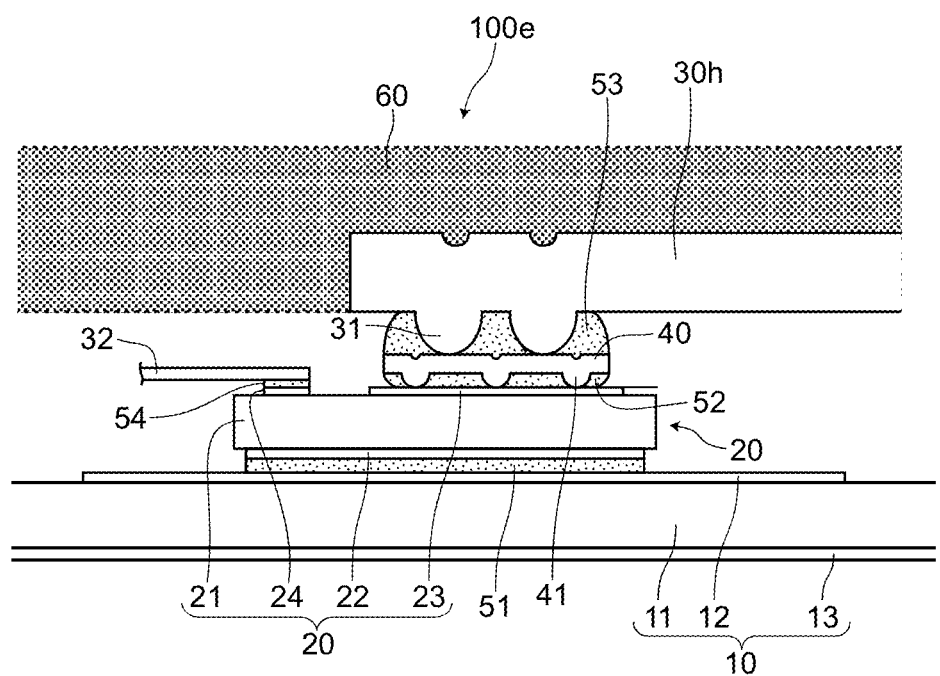
FIG. 11 is a view for describing a semiconductor device 100e according to an embodiment 5.

FIG. 11 is an enlarged cross-sectional view of a main part for describing a semiconductor device 100e according to an embodiment 5.

The semiconductor device 100e according to the embodiment 5 has basically substantially the same configuration as the semiconductor device 100 according to the embodiment 1 or the semiconductor device 100a according to the embodiment 2. However, the semiconductor device 100e according to the embodiment 5 differs from the semiconductor device 100 according to the embodiment 1 with respect to the configuration of a metal frame. That is, in the semiconductor device 100e according to the embodiment 5, a convex portion 31 is also formed on the metal frame 30h at a position which corresponds to a metal plate 40.

The convex portion 31 of the metal frame 30h is formed by embossing the metal frame 30h. The metal frame 30h has a relatively large thickness so as to allow a large current to flow the metal frame 30h and hence, when embossing is applied to the metal frame 30h, a relatively large convex portion is formed (a height (a height up to the convex portion 31 using a region of the metal frame where the convex portion 31 is not formed as a reference) and a width being large). However, so long as the convex portion corresponds to the metal plate 40, it is unnecessary to form the convex portion which corresponds to a fine source electrode 23 and hence, a distance between the metal plate 40 and the metal frame 30h can be maintained at a fixed value or more.

In this manner, the semiconductor device 100e according to the embodiment 5 differs from the semiconductor device 100 according to the embodiment 1 or the semiconductor device 100a according to the embodiment 2 with respect to the configuration of the metal frame. However, in the same manner as the case of the semiconductor device 100 according to the embodiment 1 or the semiconductor device 100a according to the embodiment 2, the stress relaxation structure is configured such that at least one convex portion 41 is formed on the metal plate 40 at the position which corresponds to the source electrode 23. Accordingly, it is possible to ensure a distance amounting to at least a height of the convex portions 41 between the metal plate 40 and the source electrode 23 by the convex portions 41 and hence, a distance between a region of the metal plate 40 where the convex portion 41 is not formed and the source electrode 23 can be set to a fixed value or more. Accordingly, a thickness of the conductive bonding material 52 disposed between the region of the metal plate 40 where the convex portion 41 is not formed and the source electrode 23 can be set to a fixed value or more. As a result, a stress (for example, a thermal stress) applied to the conductive bonding materials 52, 53 and the metal plate 40 between the semiconductor element 20 and the metal frame 30 can be relaxed.

Further, in the semiconductor device 100e according to the embodiment 5, the convex portion 31 is formed also on the metal frame 30h at a position which corresponds to the metal plate 40. With such a configuration, it is possible to ensure a distance amounting to at least a height of the convex portions 31 between the metal frame 30h and the metal plate 40 by the convex portions 31 and hence, a distance between a region of the metal frame 30h where the convex portion 31 is not formed and the metal plate 40 can be set to a fixed value or more. Accordingly, a thickness of the conductive bonding material 53 disposed between the region of the metal frame 30h where the convex portion 31 is not formed and the metal plate 40 can be set to a fixed value or more. As a result, a stress (for example, a thermal stress) applied to the conductive bonding material between the semiconductor element 20 and the metal frame 30h can be relaxed.

The semiconductor device 100e according to the embodiment 5 has substantially the same configuration as the semiconductor device 100 according to the embodiment 1 or the semiconductor device 100a according to the embodiment 2 with respect to points other than the configuration of the metal frame and hence, the semiconductor device 100e according to the embodiment 5 acquires the corresponding advantageous effects found amongst all advantageous effects which the semiconductor device 100 according to the embodiment 1 or the semiconductor device 100a according to the embodiment 2 acquires.

Embodiment 6 to 13

Figure 12A:
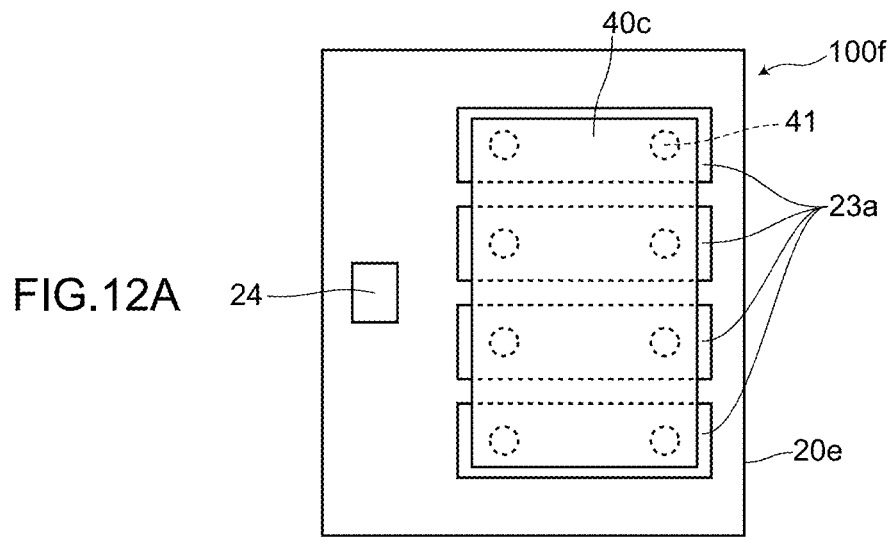
FIG. 12A, FIG. 12B and FIG. 12C are views for describing semiconductor devices 100f to 100h according to embodiments 6 to 8.
Figure 12B:
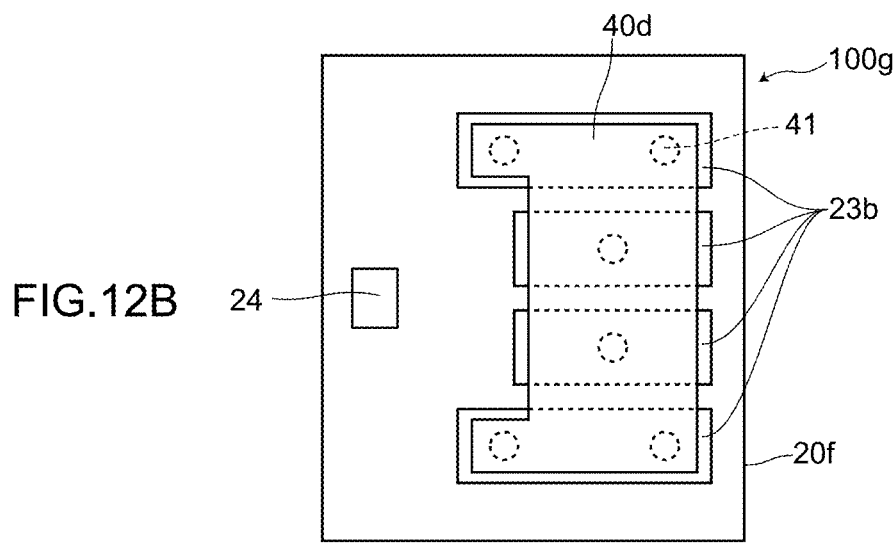
Figure 12C:
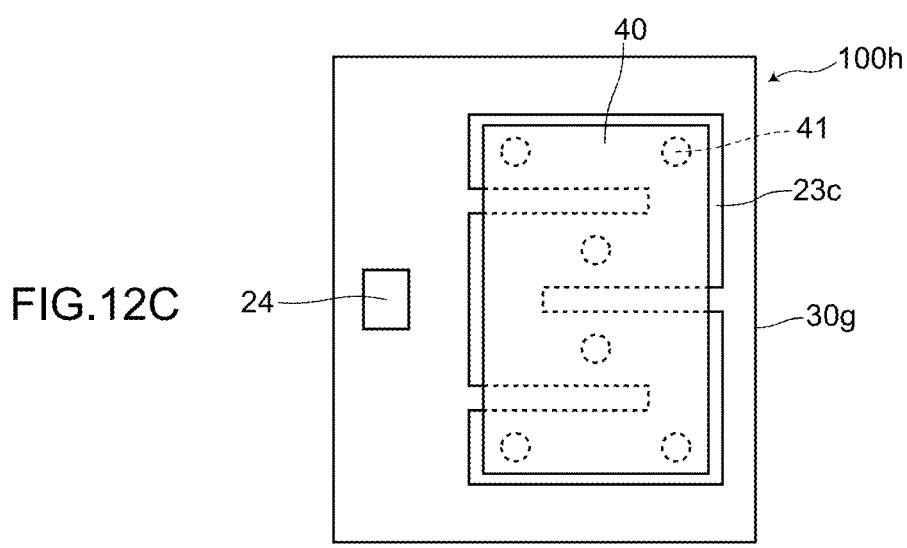
Figure 13A:
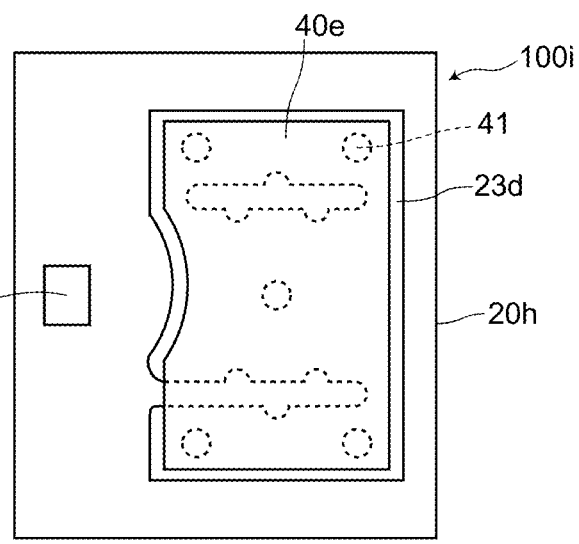
FIG. 13A, FIG. 13B and FIG. 13C are views for describing semiconductor devices 100i to 100k according to embodiments 9 to 11.
Figure 13B:
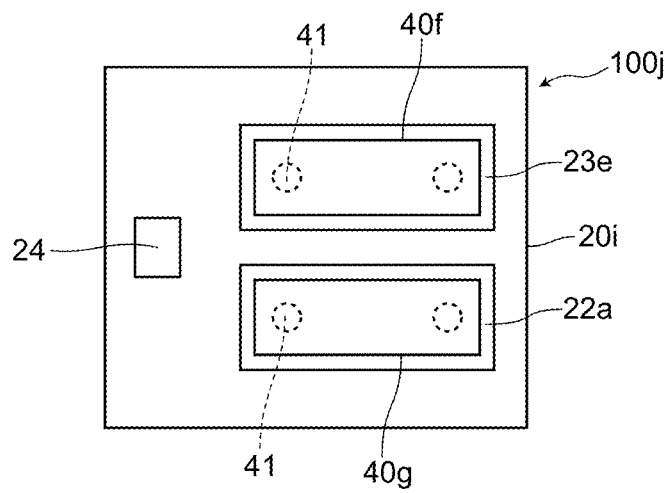
Figure 13C:
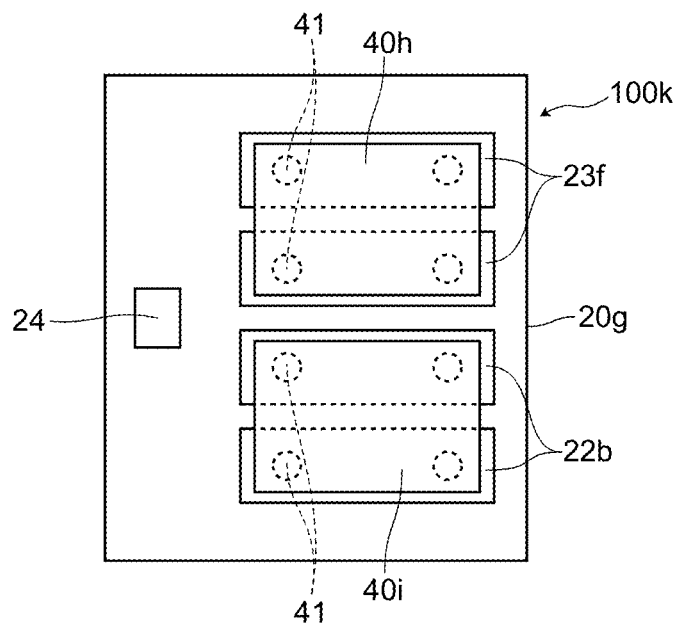
Figure 14:
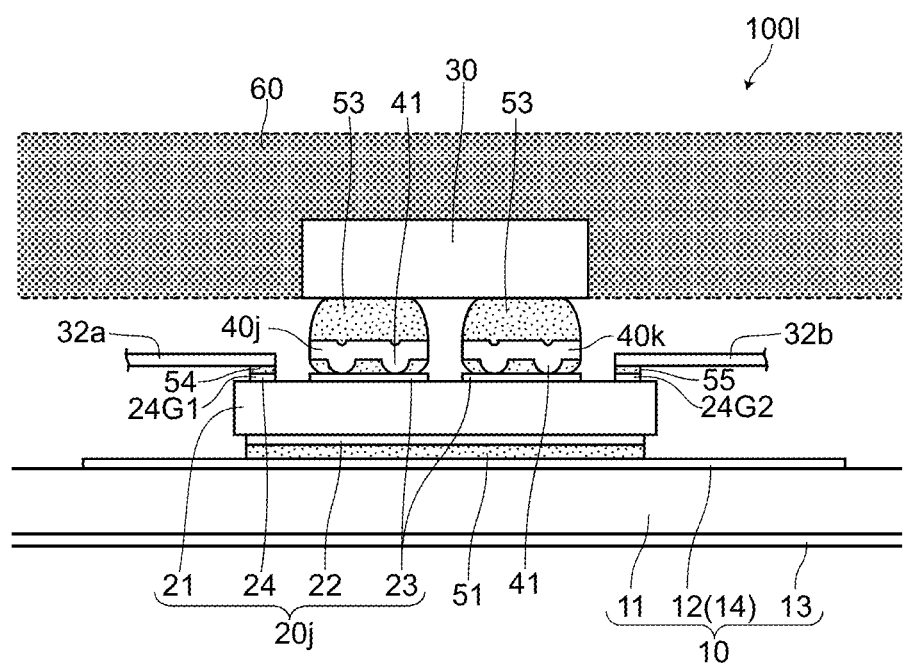
FIG. 14 is a schematic cross-sectional view of a semiconductor device 100l according to an embodiment 12.
Figure 15A:
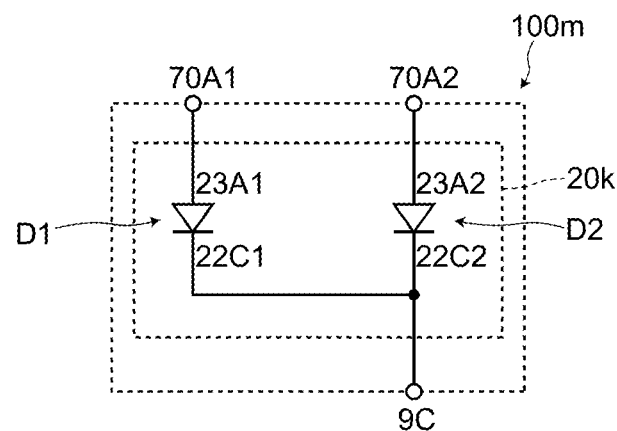
FIG. 15A and FIG. 15B are views for describing a semiconductor device 100m according to an embodiment 13.
Figure 15B:
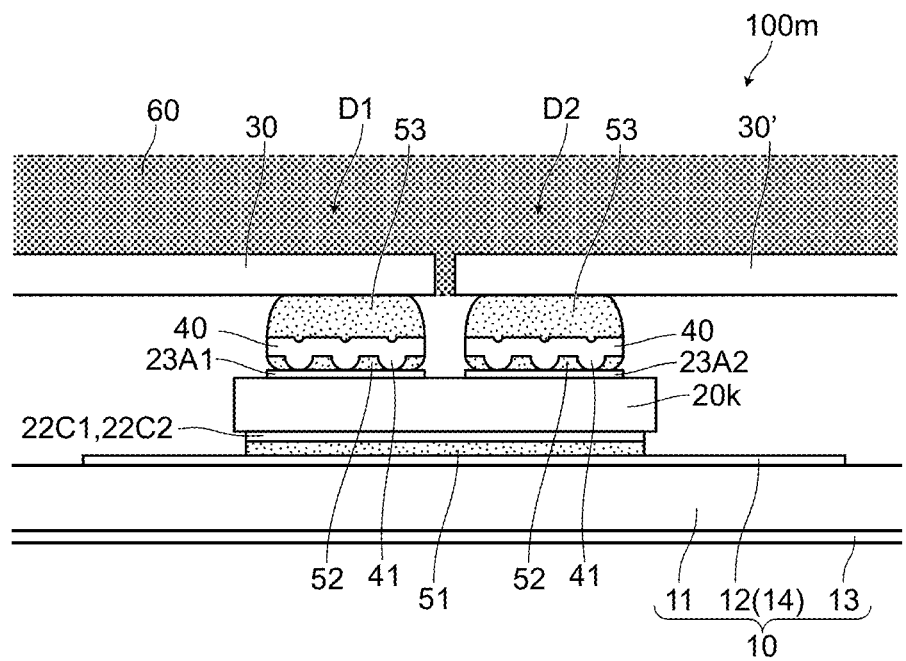
Figure 16:
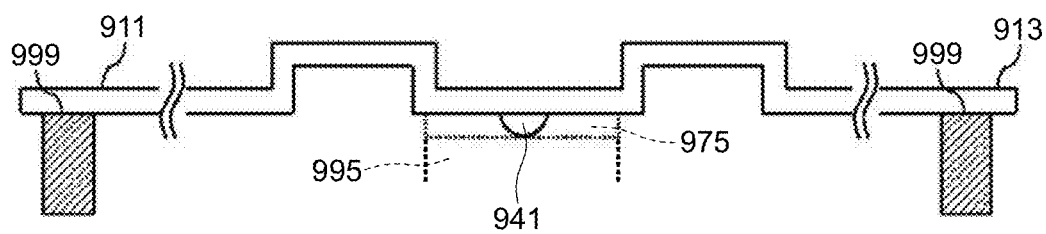
FIG. 16 is a view for describing a conventional semiconductor device 900.

FIG. 12A, FIG. 12B and FIG. 12C are views for describing semiconductor devices 100f to 100h according to embodiments 6 to 8. FIG. 12A is an enlarged cross-sectional view of a main part of the semiconductor device 100f according to the embodiment 6, FIG. 12B is an enlarged cross-sectional view of a main part of the semiconductor device 100g according to the embodiment 7, and FIG. 12C is an enlarged cross-sectional view of a main part of the semiconductor device 100h according to the embodiment 8. FIG. 13A, FIG. 13B and FIG. 13C are views for describing semiconductor devices 100i to 100k according to embodiments 9 to 11. FIG. 13A is a view for describing the semiconductor device 100i according to the embodiment 9, FIG. 13B is a view for describing the semiconductor device 100j according to the embodiment 10, and FIG. 13C is a view for describing the semiconductor device 100k according to the embodiment 11. FIG. 14 is an enlarged cross-sectional view of a main part of a semiconductor device 100l according to an embodiment 12. FIG. 15A and FIG. 15B are views for describing a semiconductor device 100m according to an embodiment 13. FIG. 15A is a circuit diagram of a main part of the semiconductor device 100m, and FIG. 15B is an enlarged cross-sectional view of a main part of the semiconductor device 100m.

The semiconductor devices 100f to 100m according to the embodiments 6 to 13 have basically substantially the same configuration as the semiconductor device 100 according to the embodiment 1 or the semiconductor device 100a according to the embodiment 2. However, the semiconductor devices 100f to 100m according to the embodiments 6 to 13 differ from the semiconductor device 100a according to the embodiment 2 with respect to the configuration of at least one of the metal plate, the convex portion, and the source electrode.

As shown in FIG. 12A, the semiconductor device 100f according to the embodiment 6 differs from the semiconductor device 100 according to the embodiment 1 or the semiconductor device 100a according to the embodiment 2 with respect to the configuration where a cutout is not formed in a metal plate 40c, the metal plate 40c is formed in an approximately rectangular shape, and two convex portions 41 are formed in four regions of a source electrode 23a respectively at substantially same positions in the respective regions. With such a configuration, currents which flow through four regions can be made equal easily.

As shown in FIG. 12B, in the semiconductor device 100g according to the embodiment 7, a source electrode 23a is divided into a plurality of regions (four regions). Among these four regions, the regions disposed close to a gate electrode 24 are formed with a small length, and a metal plate 40d is formed in a shape (approximately U shape) which corresponds to the shape of the source electrode 23b. With such a configuration, short-circuiting between the conductive bonding materials 52, 53 on a source electrode side and the gate electrode 24 can be suppressed with certainty.

As shown in FIG. 12C, in the semiconductor device 100h according to the embodiment 8, a source electrode 23c has four regions. However, these regions are not independently formed, and one end portions of these regions are connected with each other. Accordingly, these four regions are formed in a shape that one electrode meanders as viewed in a plan view. As a metal plate 40, a metal plate which has an approximately rectangular shape as viewed in a plan view, and in which a convex portion is formed on the metal plate at a position which corresponds to a laterally elongated region of the source electrode 23c is used.

As shown in FIG. 13A, in the semiconductor device 100i according to the embodiment 9, a source electrode 23d is divided into three regions. However, these regions are not completely separated from each other, and the plurality of regions may be connected with each other at two portions. Holes may be formed so as to form a plurality of partitioned regions (see FIG. 13A). Alternatively, the plurality of regions may be connected to each other at a portion. That is, a region by which a plurality of partitioned regions are formed may be formed in a cutout shape (see FIG. 13A). Both a metal plate 40e and the source electrode 23d may be cutout in a rounded shape so as to avoid a gate electrode 24. The metal plate 40e is formed in an approximately rectangular shape, and a convex portion 41 is formed on respective corner portions and a center portion of the metal plate 40e respectively. Even in the case where the source electrode 23d has a particular shape, the present invention can be applicable.

As shown in FIG. 13B, in the semiconductor device 100j according to the embodiment 10, on a surface of a semiconductor element 20a on a metal frame side (a surface of the semiconductor element 20a on a side opposite to a circuit board 10), both a source electrode 23e and a drain electrode 22a which form a main electrode, and a gate electrode which forms a sub electrode are formed. These electrodes are respectively connected to a metal frame (not shown in the drawing). A metal plate 40f is disposed between the metal frame (not shown in the drawing) and the source electrode 23e, and a metal plate 40g is disposed between the metal frame (not shown in the drawing) and the drain electrode 22a.

As shown in FIG. 13C, in the semiconductor device 100k according to the embodiment 11, a source electrode 23f and a drain electrode 22b are divided into a plurality of regions respectively.

As shown in FIG. 14, in the semiconductor device 100l according to the embodiment 12, a source electrode is divided into a plurality of regions, and metal plates 40j, 40k and conductive bonding materials 52, 53 are disposed for the plurality of respective regions. A metal frame 30 is used in common. In place of dividing the source electrode, different electrodes (provided that the electrodes having the same potential) may be used.

As shown in FIG. 14, in the semiconductor device 100l according to the embodiment 12, main electrodes of different semiconductor elements may be connected by a common metal frame, and metal plates may be arranged between the common metal frame and the respective main electrodes.

As shown in FIG. 15A and FIG. 15B, in the semiconductor device 100m according to the embodiment 13, as a semiconductor element, a diode may be arranged on a circuit board 10, and two diodes may be connected with each other in parallel on a common wiring pattern.

In this manner, the semiconductor devices 100e to 100m according to the embodiments 5 to 13 differ from the semiconductor device 100 according to the embodiment 1 or the semiconductor device 100a according to the embodiment 2 with respect to the configuration of at least one of the metal plate, the convex portion, and the source electrode. However, in the same manner as the case of the semiconductor device 100 according to the embodiment 1 or the semiconductor device 100a according to the embodiment 2, the stress relaxation structure is configured such that at least one convex portion is formed on the metal plate at the position which corresponds to the main electrode. Accordingly, it is possible to ensure the distance amounting to at least the height of the convex portion between the metal plate and the main electrode by the convex portion, and the distance between the region of the metal plate where the convex portion is not formed and the main electrode can be set to a fixed value or more. Accordingly, the thickness of the conductive bonding material disposed between the region of the metal plate where the convex portions are not formed and the main electrode can be set to a fixed value or more. As a result, a stress (for example, a thermal stress) applied to the conductive bonding material and the metal plate between the semiconductor element and the metal frame can be relaxed.

The semiconductor devices 100e to 100m according to the embodiments 5 to 13 has substantially the same configuration as the semiconductor device 100 according to the embodiment 1 or the semiconductor device 100a according to the embodiment 2 with respect to points other than the configuration of at least one of the metal plate, the convex portion, and the source electrode and hence, the semiconductor devices 100e to 100m according to the embodiments 5 to 13 acquire the corresponding advantageous effects found amongst all advantageous effects which the semiconductor device 100 according to the embodiment 1 or the semiconductor device 100a according to the embodiment 2 acquires.

Although the present invention has been described heretofore with reference to the above-mentioned embodiments, the present invention is not limited to such embodiments. The present invention can be carried out in various modes without departing from the gist of the present invention, and the following modifications are conceivable, for example.

(1) In the above-mentioned respective embodiments, the number of the constitutional elements, the positions of the constitutional elements and the like are provided only for an exemplifying purpose, and can be changed within a range that advantageous effects of the present invention are not impaired.

(2) In the above-mentioned respective embodiments 3 to 13, the description has been made with reference to the semiconductor device 100 according to the embodiment 1 or the semiconductor device 100a according to the embodiment 2. However, the present invention is not limited to these embodiments, and the present invention is also applicable to semiconductor devices formed by combining the technical features of the respective embodiments.

(3) A MOSFET is used as the semiconductor element in the above-mentioned respective embodiments 1 to 12, and a diode is used as the semiconductor element in the above-mentioned embodiment 13. However, the present invention is not limited to such a case. A diode may be used as the semiconductor element in the above-mentioned respective embodiments 1 to 12, and a MOSFET may be used as the semiconductor element in the above-mentioned embodiment 3. A switching element other than a MOSFET such as an IGBT, a rectifier such as a Schottky barrier diode, a control rectifier such as thyristor and other suitable elements may be used in the above-mentioned respective embodiments 1 to 13.

The invention claimed is:

1. A semiconductor device comprising:
    a circuit board;
    a semiconductor element mounted on the circuit board;
    a connector electrically connected to a main electrode of the semiconductor element; and
    a metal plate having a flat plate shape, the metal plate disposed between the connector and the main electrode, wherein
    the metal plate has at least one convex portion protruding toward a side of the main electrode,
    the connector is electrically connected to the main electrode via a first conductive bonding material disposed between the main electrode and the metal plate, the metal plate, and a second conductive bonding material disposed between the metal plate and the connector, and
    the metal plate is configured to relax a stress applied to the first conductive bonding material and the second conductive bonding material from the circuit board and the semiconductor element.

2. The semiconductor device according to claim 1, wherein the metal plate is a flat plate having a thickness smaller than a thickness of the connector, and is elastically deformable in a plate thickness direction.

3. The semiconductor device according to claim 1, wherein the metal plate is disposed in a state where the convex portion is brought into contact with the main electrode.

4. The semiconductor device according to claim 1, wherein the metal plate also has at least one convex portion which protrudes toward a side of the connector also on a surface of the metal plate which faces the connector.

5. The semiconductor device according to claim 1, wherein the main electrode of the semiconductor element is divided into a plurality of regions, and
    the metal plate has a plurality of the convex portions formed at positions corresponding to the plurality of respective main regions of the main electrode.

6. The semiconductor device according to claim 1, wherein the semiconductor element further has a sub electrode on a surface of the semiconductor element on which the main electrode is formed, and
    a cutout is formed in the metal plate so as to avoid the sub electrode.

* * * * *